(12) United States Patent
Sasagawa et al.

(10) Patent No.: US 8,987,727 B2
(45) Date of Patent: Mar. 24, 2015

(54) METHOD FOR MANUFACTURING SEMICONDUCTOR DEVICE AND SEMICONDUCTOR DEVICE

(75) Inventors: Shinya Sasagawa, Chigasaki (JP); Motomu Kurata, Isehara (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 220 days.

(21) Appl. No.: 13/357,902

(22) Filed: Jan. 25, 2012

(65) Prior Publication Data
US 2012/0193625 A1    Aug. 2, 2012

(30) Foreign Application Priority Data
Jan. 28, 2011    (JP) ................. 2011-016343

(51) Int. Cl.
H01L 29/786    (2006.01)
H01L 21/34    (2006.01)
H01L 29/417    (2006.01)

(52) U.S. Cl.
CPC ...... H01L 29/41733 (2013.01); H01L 29/7869 (2013.01)
USPC    257/43; 257/57; 257/E29.296; 257/E21.459; 438/104; 438/158

(58) Field of Classification Search
USPC ......... 257/223, 227, 291, 292, 439, 443, 655, 257/E27.1, E27.125, E27.112, E29.117, 257/E29.145, E29.147, E29.151, E29.182, 257/E29.202, E29.273–E29.299, E29.314, 257/E29.32, E23.016
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Nakayama et al., "17a-TL-8 Effect of GaO Layer on IGZO-TFT Channel," Extended Abstracts (The 57th Spring Meeting 2010), The Japan Society of Applied Physics and Related Societies, Mar. 17, 2010, pp. 21-008

(Continued)

*Primary Examiner* — David Vu
*Assistant Examiner* — Jonathan Han
(74) *Attorney, Agent, or Firm* — Eric J. Robinson; Robinson Intellectual Property Law Office, P.C.

(57) ABSTRACT

An object is to provide a semiconductor device in which defects are reduced and miniaturization is achieved while favorable characteristics are maintained. A semiconductor layer is formed; a first conductive layer is formed over the semiconductor layer; the first conductive layer is etched with use of a first resist mask to form a second conductive layer having a recessed portion; the first resist mask is reduced in size to form a second resist mask; the second conductive layer is etched with use of the second resist mask to form source and drain electrodes each having a projecting portion with a tapered shape at the peripheries; a gate insulating layer is formed over the source and drain electrodes to be in contact with part of the semiconductor layer; and a gate electrode is formed in a portion over the gate insulating layer and overlapping with the semiconductor layer.

17 Claims, 11 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,994,500 B2 | 8/2011 | Kim et al. |
| 8,058,645 B2 | 11/2011 | Jeong et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,274,078 B2 | 9/2012 | Itagaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0267097 A1* | 11/2006 | Codama ................. 257/347 |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0093003 A1* | 4/2007 | Wu et al. ................. 438/149 |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0117077 A1* | 5/2010 | Yamazaki et al. ................. 257/43 |
| 2010/0320458 A1 | 12/2010 | Umeda et al. |
| 2010/0320459 A1 | 12/2010 | Umeda et al. |
| 2011/0147739 A1* | 6/2011 | Yamazaki et al. ................. 257/43 |
| 2011/0193083 A1 | 8/2011 | Kim et al. |
| 2011/0215328 A1 | 9/2011 | Morosawa et al. |
| 2012/0119205 A1 | 5/2012 | Taniguchi et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-023103 A | 1/1996 |
| JP | 08-264794 A | 10/1996 |
| JP | 09-018006 A | 1/1997 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2008-159717 A | 7/2008 |
| JP | 2009-231613 | 10/2009 |
| JP | 2009-267296 A | 11/2009 |
| JP | 2010-016347 | 1/2010 |
| JP | 2010-021170 A | 1/2010 |
| JP | 4415062 | 2/2010 |
| JP | 2010-067954 | 3/2010 |
| JP | 2010-177431 | 8/2010 |
| JP | 4571221 | 10/2010 |
| JP | 2011-014761 A | 1/2011 |
| JP | 2012-160679 | 8/2012 |
| WO | WO-2004/114391 | 12/2004 |
| WO | WO2008/133345 | 11/2008 |

OTHER PUBLICATIONS

International Search Report (Application No. PCT/JP2012/051582) Dated Apr. 10, 2012.

(56) References Cited

OTHER PUBLICATIONS

Written Opinion (Application No. PCT/JP2012/051582) Apr. 10, 2012.
Kawamura et al., "Low-Voltage Operating Amorphous Oxide TFTs," IDW '09: Proceedings of the 16th International Display Workshops, Dec. 9, 2009, pp. 1689-1692.
Song et al., "34.1: Advanced Four-Mask Process Architecture for the a-Si TFT Array Manufacturing Method," SID Digest '02: SID International Symposium Digest of Technical Papers, 2002, pp. 1038-1041, vol. 33.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Kimizuka.N. et al., "Spinel,YbFe2O4, and Yb2Fe3O7 Types of Structures for Compounds in the In2O3 and Sc2O3—A2O3—BO Systems [A; Fe, Ga, Or Al; B: Mg, Mn, Fe, Ni, Cu, or Zn] At Temperatures Over 1000° C", Journal of Solid State Chemistry, 1985, vol. 60, pp. 382-384.
Nakamura.M et al., "The phase relations in the In2O3—Ga2ZnO4—ZnO system at 1350° C", Journal of Solid State Chemistry, Aug. 1, 1991, vol. 93, No. 2, pp. 298-315.
Kitzerow.H et al., "Observation of Blue Phases in Chiral Networks", Liquid Crystals, 1993, vol. 14, No. 3, pp. 911-916.
Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Kikuchi.H et al., "Polymer-Stabilized Liquid Crystal Blue Phases", Nature Materials, Sep. 2, 2002, vol. 1, pp. 64-68.
Tsuda.K et al., "Ultra Low Power Consumption Technologies for Mobile TFT-LCDs", IDW '02 : Proceedings of The 9th International Display Workshops, Dec. 4, 2002, pp. 295-298.
Nomura.K et al., "Thin-Film Transistor Fabricated in Single-Crystalline Transparent Oxide Semiconductor", Science, May 23, 2003, vol. 300, No. 5623, pp. 1269-1272.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.
Lee.H at al., "Current Status of, Challenges to, and Perspective View of AM-OlED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZnO TFTs) for AMLCDS", Journal of the SID, 2007, vol. 15, No. 1, pp. 17-22.
Park.S et al., "Challenge to Future Displays: Transparent AM-OLED Driven by Peald Grown ZnO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Miyasaka.M, "Suftla Flexible Microelectronics on Their Way to Business", SID Digest '07 : SID International Symposium Digest of Technical Pepers, 2007, vol. 38, pp. 1673-1676.
Kurokawa.Y et al., "UHF RFCPUS on Flexible and Glass Substrates for Secure RFID Systems", Journal of Solid-State Circuits, 2008, vol. 43, No. 1, pp. 292-299.
Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Asaoka.Y et al., "29.1: Polarizer-Free Reflective LCD Combined With Ultra Low-Power Driving technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn—Oxide TFT", SID International Symposium Digest of Technical Papers, May 31, 2009, pp. 184-187.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

(56) References Cited

OTHER PUBLICATIONS

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digest of technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1995, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m <4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanses Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J at al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of The 6th International Display Workshops, Dec. 3, 2008, pp. 581-584.

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

* cited by examiner

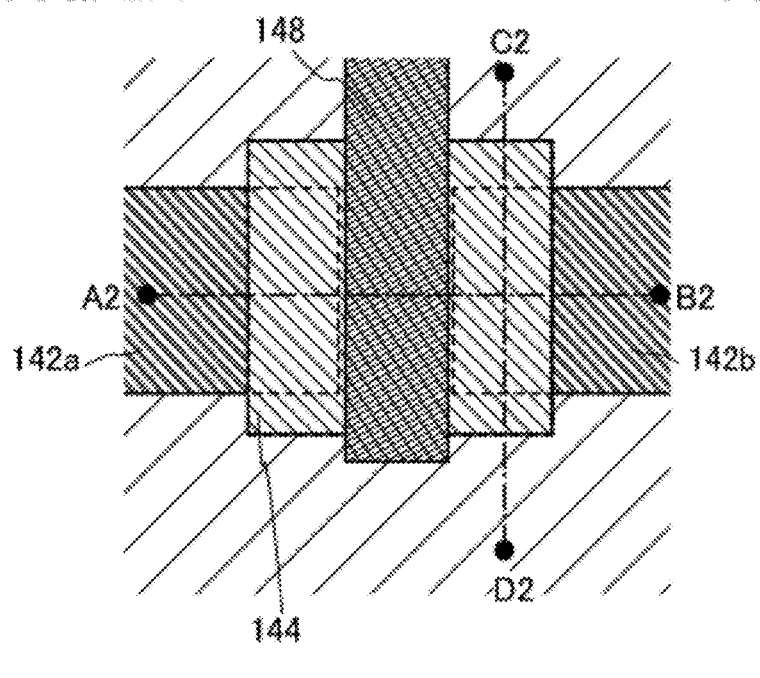
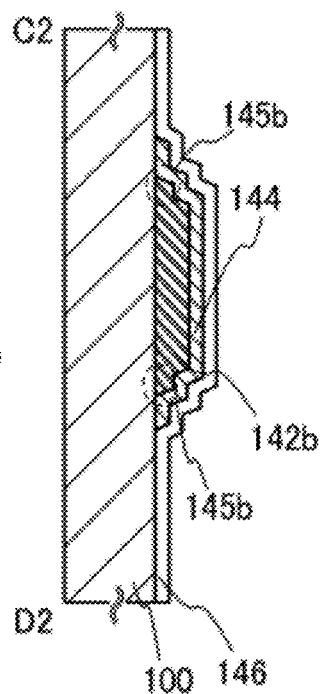
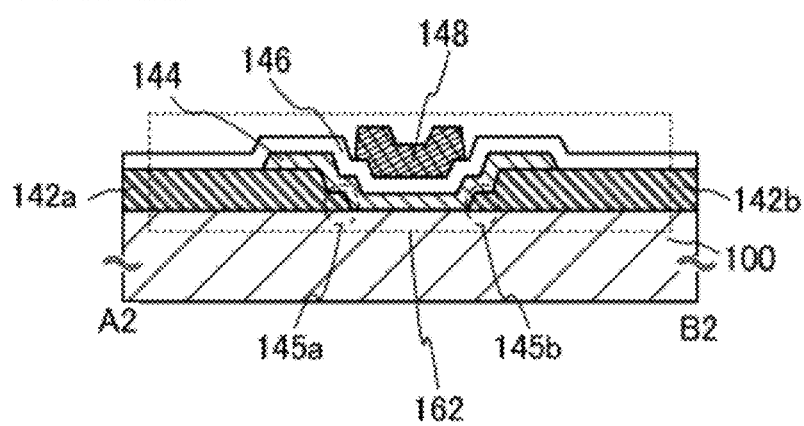

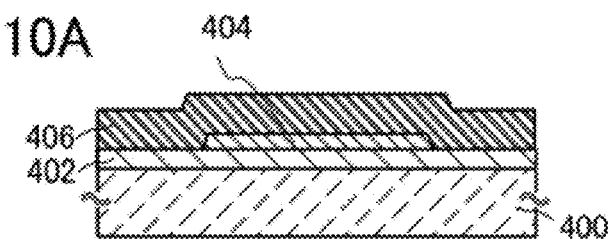
FIG. 10A
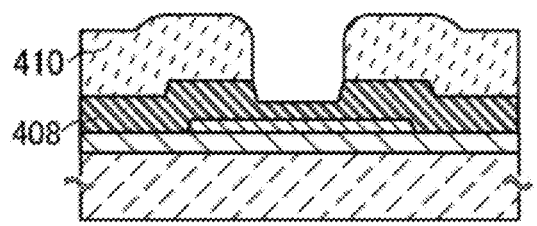
FIG. 10B1
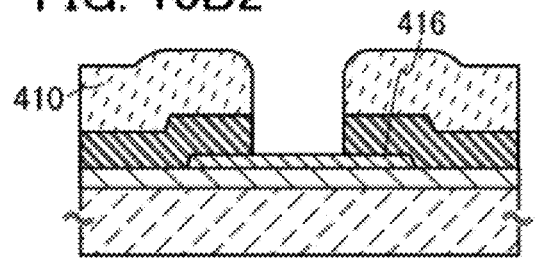
FIG. 10B2
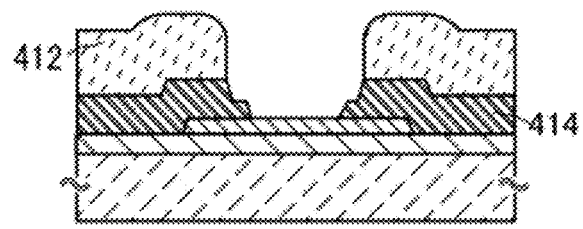
FIG. 10C1
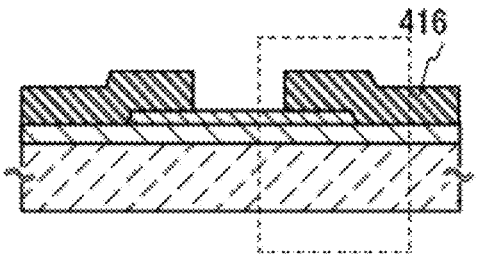
FIG. 10C2
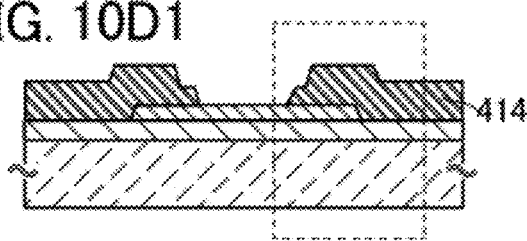
FIG. 10D1

METHOD FOR MANUFACTURING SEMICONDUCTOR DEVICE AND SEMICONDUCTOR DEVICE

TECHNICAL FIELD

The technical field of the invention to be disclosed relates to a semiconductor device and a method for manufacturing the semiconductor device.

BACKGROUND ART

A technique by which transistors are formed using semiconductor thin films formed over a substrate having an insulating surface has been attracting attention. The transistor is applied to a wide range of electronic devices such as an integrated circuit (IC) or an image display device (display device). As known semiconductor thin films which can be used for transistors, a silicon-based semiconductor material, an oxide semiconductor, and the like are used.

In order to achieve high speed operation of a transistor, miniaturization of the transistor is needed. For example, in Patent Document 1, a thin film transistor including an oxide semiconductor used for a channel layer with a thickness of about 10 nm or smaller is disclosed. In Non-Patent Document 1, a thin film transistor including an oxide semiconductor whose channel length is 2 μm to 100 μm is disclosed.

REFERENCE

Patent Document

[Patent Document 1] Japanese Published Patent Application No. 2010-021170

Non-Patent Document

[Non-Patent Document 1] T. Kawamura, H. Uchiyama, S. Saito, H. Wakana, T. Mine, and M. Hatano, "Low-Voltage Operating Amorphous Oxide TFTs", IDW'09, pp.

DISCLOSURE OF INVENTION

In the case where a transistor is miniaturized, defects generated in a manufacturing process become a major problem. For example, in a transistor where a semiconductor layer or a gate insulating layer is formed over a wiring functioning as a source or drain electrode, a gate electrode or the like, the wiring has a larger thickness than the semiconductor layer, which causes poor coverage with the semiconductor layer or the gate insulating layer when the thickness of the semiconductor layer or the gate insulating layer is reduced along with miniaturization. As a result, disconnection, defective connection, or the like may occur.

In particular, in the case where a miniaturized transistor whose channel length (L) is shorter is manufactured, light with a short wavelength less than or equal to 365 nm (i-line) is preferably used as a light source in photolithography in order to improve resolution of the pattern. However, in the case of using the i-line as a light source in photolithography, coverage with a thin film formed over the wiring is more likely to be degraded because it is difficult to form an end portion of the pattern into a tapered shape, as compared with the case of using light with a longer wavelength, e.g., 436 nm (g-line).

Thus, it is an object of the disclosed invention to provide a semiconductor device which achieves miniaturization while the defects are suppressed. Further, it is another object to provide a semiconductor device which achieves miniaturization while favorable characteristics are maintained.

In a semiconductor device according to one embodiment of the present invention, a projecting portion is provided at the periphery of a wiring with a large thickness (a gate electrode, or a source or drain electrode). Further, in a manufacturing process of the wiring, half etching of a conductive layer, a reduction in size of a resist mask, and etching with use of the reduced resist mask are performed, whereby the periphery of the wiring can be formed to have a tapered shape even when light with a short wavelength less than or equal to 365 nm is used as a light source in photolithography. Specifically, the following structure can be employed for example.

One embodiment of the present invention is a method for manufacturing a semiconductor device including steps of: forming a semiconductor layer; forming a first conductive layer of a single layer over the semiconductor layer; forming a first resist mask over the first conductive layer with use of light with a wavelength less than or equal to 365 nm; etching the first conductive layer with use of the first resist mask to form a second conductive layer having a recessed portion; reducing the first resist mask in size to form a second resist mask; etching the second conductive layer with use of the second resist mask to form a source electrode and a drain electrode each having a projecting portion with a tapered shape at peripheries of the source electrode and the drain electrode; forming a gate insulating layer over the source electrode and the drain electrode and in contact with a part of the semiconductor layer; and forming a gate electrode in a portion which is over the gate insulating layer and overlaps with the semiconductor layer.

Further, one embodiment of the present invention is a method for manufacturing a semiconductor device including steps of: forming a first conductive layer; forming a first resist mask over the first conductive layer with use of light with a wavelength less than or equal to 365 nm; etching the first conducive layer with use of the first resist mask to form a second conductive layer having a recessed portion; reducing the first resist mask in size to form a second resist mask; etching the second conductive layer with use of the second resist mask to form a source electrode and a drain electrode each having a projecting portion with a tapered shape at peripheries of the source electrode and the drain electrode; forming a semiconductor layer over the source electrode and the drain electrode; forming a gate insulating layer over the semiconductor layer; and forming a gate electrode in a portion which is over the gate insulating layer and overlaps with the semiconductor layer.

In the above method for manufacturing a semiconductor device, it is preferable to use an oxide semiconductor layer as the semiconductor layer.

Further, another embodiment of the present invention is a semiconductor device including: a semiconductor layer at least including a channel formation region; a source electrode and a drain electrode formed of a single layer and being partly in contact with the semiconductor layer; a gate insulating layer over the source electrode and the drain electrode and in contact with the channel formation region; and a gate electrode overlapping with the channel formation region with the gate insulating layer positioned therebetween. A channel length in the channel formation region is less than 2 μm. The source electrode and the drain electrode each have a projecting portion at peripheries of the source electrode and the drain electrode, and the projecting portion has a tapered shape.

In the above semiconductor device, the gate insulating layer may be in contact with the source electrode and the drain electrode at least in the projecting portions.

Further, in the above semiconductor device, the semiconductor layer may be in contact with the source electrode and the drain electrode at least in the projecting portions.

In any of the semiconductor devices, the projecting portion in the source electrode may have the same width and the same thickness as the projecting portion in the drain electrode.

Further, another embodiment of the present invention is a semiconductor device including: a gate electrode formed of a single layer; a gate insulating layer over and in contact with the gate electrode; a semiconductor layer at least including a channel formation region, the semiconductor layer overlapping with the gate electrode with the gate insulating layer positioned therebetween; and a source electrode and a drain electrode partly in contact with the semiconductor layer. In the channel formation region, a length in a direction where carrier flows is less than 2 μm. The gate electrode has a projecting portion at a periphery of the gate electrode and the projecting portion has a tapered shape.

In the above semiconductor device, the gate insulating layer may be in contact with the gate electrode at least in the projecting portion.

In any of the above semiconductor devices, it is preferable that the semiconductor layer be an oxide semiconductor layer.

Note that semiconductor devices herein refer to general devices which function by utilizing semiconductor characteristics. For example, a display device, a memory device, an integrated circuit, and the like are included in the category of the semiconductor device.

In this specification and the like, the terms "over" and "below" do not necessarily mean "directly on" and "directly below", respectively, in the description of the positional relationship between components. For example, the expression "a gate electrode over a gate insulating layer" does not exclude the case where a component is placed between the gate insulating layer and the gate electrode.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" are formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be used to denote the drain and the source, respectively, in this specification.

Note that in this specification and the like, the term "electrically connected" includes the case where components are connected through an object having any electric function. There is no particular limitation on an object having any electric function as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

Note that in this specification and the like, the term "same" includes a reasonable amount of deviation of the term such that the end result is not significantly changed. For example, films formed in the same step have the same thickness, and variation during the film-formation step is allowable.

As described above, according to one embodiment of the disclosed invention, a semiconductor device which achieves miniaturization can be provided while the defects are suppressed or favorable characteristics are maintained.

According to one embodiment of the disclosed invention, a problem caused by miniaturization can be resolved. As a result, the size of the transistor can be sufficiently reduced. By sufficiently reducing the size of the transistor, the area of a semiconductor device including the transistor is decreased, and the number of semiconductor devices manufactured from one substrate is increased. Thus, the cost for manufacturing semiconductor devices can be reduced. Furthermore, effects of high-speed operation, low power consumption, and the like of a transistor can be obtained in accordance with a reduction in channel length.

BRIEF DESCRIPTION OF DRAWINGS

FIG. 2A is a plan view and FIGS. 2B and 2C are cross-sectional views illustrating an example of a structure of a semiconductor device.

FIGS. 10A, 10B1 and 10B2, 10C1 and 10C2, and 10D1 are cross-sectional views illustrating a manufacturing process of samples manufactured in Example.

BEST MODE FOR CARRYING OUT THE INVENTION

Figure 1A:
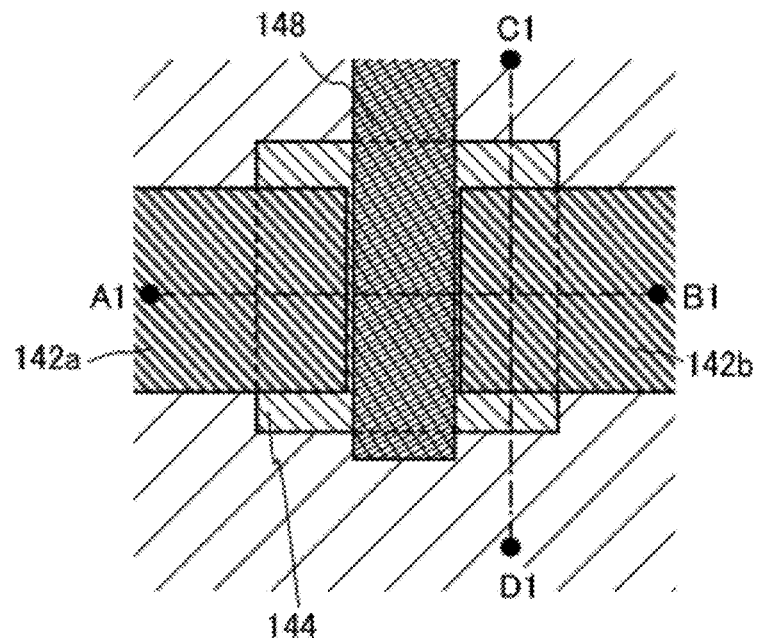
FIG. 1A is a plan view and FIGS. 1B and 1C are cross-sectional views illustrating an example of a structure of a semiconductor device.

Embodiments of the present invention will be described in detail below with reference to the accompanying drawings. Note that the invention is not limited to the following description, and it will be easily understood by those skilled in the art that various changes and modifications can be made without departing from the spirit and scope of the invention. Therefore, the invention should not be construed as being limited to the description in the following embodiments. Further, structures according to different embodiments and an example can be implemented in combination as appropriate. Note that in the structure of the present invention described below, reference numerals indicating the same portions and portions having a similar function are used in common in different drawings, and repeated descriptions thereof are omitted.

Note that the position, size, range, or the like of each component illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not limit the components numerically.

(Embodiment 1)

In this embodiment, a structure and a manufacturing method of a semiconductor device according to one embodiment of the disclosed invention will be described with reference to drawings.

<Structural Example of Semiconductor Device>

FIGS. 1A to 1C and FIGS. 2A to 2C illustrate structural examples of semiconductor devices.

As a semiconductor layer included in a transistor described in this embodiment, an amorphous semiconductor, a polycrystalline semiconductor, a microcrystalline (also referred to as semiamorphous) semiconductor, or the like can be used. In this embodiment, hereinafter, an example of using an oxide semiconductor layer as the semiconductor layer is described. When an oxide semiconductor is included in the transistor, the off-state current of the transistor can be reduced. Further, the on-state current and field effect mobility of the transistor including an oxide semiconductor can be increased as compared with a transistor including amorphous silicon or the like. Furthermore, the deterioration of the transistor can be suppressed. Thus, low power consumption and high speed operation of the transistor can be achieved. However, embodiments of the present invention are not limited to the above structure.

Figure 1C:
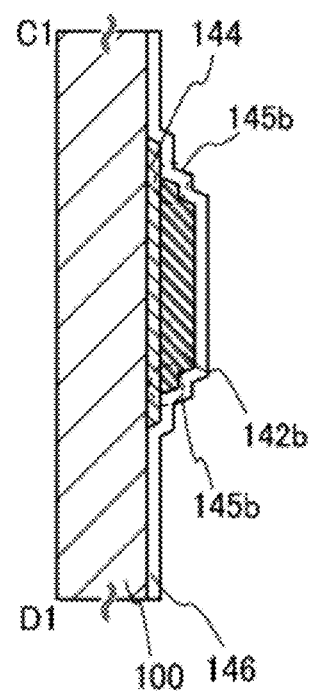
Figure 1B:
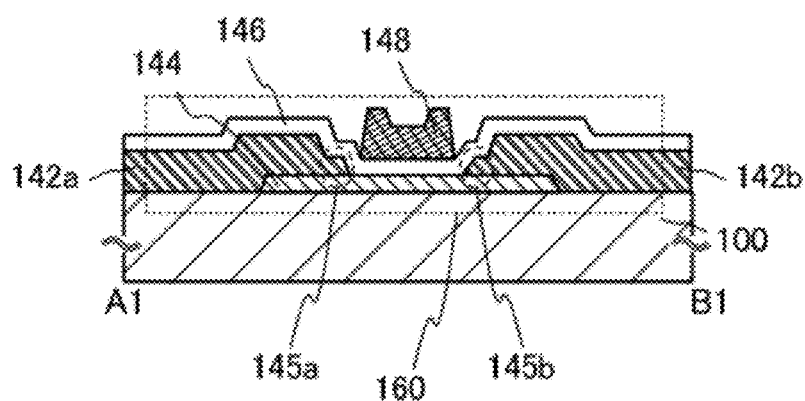

FIG. 1A is a plan view of a transistor 160, and FIG. 1B is a cross-sectional view along line A1-B1 in FIG. 1A. FIG. 1C is a cross-sectional view along line C1-D1 in FIG. 1A.

The transistor 160 illustrated in FIGS. 1A to 1C includes, over a substrate 100 having a surface over which components are formed, an oxide semiconductor layer 144 at least including a channel formation region, a source electrode 142a and a drain electrode 142b which are partly in contact with the oxide semiconductor layer 144, a gate insulating layer 146 which is provided over the source electrode 142a and the drain electrode 142b and in contact with the channel formation region of the oxide semiconductor layer 144, and a gate electrode 148 overlapping with the channel formation region of the oxide semiconductor layer 144 with the gate insulating layer 146 positioned therebetween. The source electrode 142a and the drain electrode 142b each have a step shape at the peripheries.

Note that an insulating layer may be provided to cover the gate electrode 148 and the like, and the insulating layer may be included in components of the transistor 160.

Note that the channel length L of the transistor 160 is preferably less than 2 μm, further preferably, from 10 nm to 350 nm (0.35 μm) inclusive. The thickness of the oxide semiconductor layer 144 is in the range of 1 nm to 50 nm inclusive, preferably, 2 nm to 20 nm inclusive, further preferably, 3 nm to 15 nm inclusive. With such a structure, a semiconductor device which operates at high speed and consumes less power can be achieved.

In a cross section of the transistor 160 in a direction parallel to a channel length illustrated in FIG. 1B, the source electrode 142a has, in a region in contact with the oxide semiconductor layer 144 (at a periphery of the source electrode 142a), a projecting portion 145a with a smaller thickness than the other region of the source electrode 142a (the other region is in contact with the substrate 100). The projecting portion 145a has a tapered shape. The drain electrode 142b similarly has, in a region in contact with the oxide semiconductor layer 144 (at a periphery of the drain electrode 142b), a projecting portion 145b with a smaller thickness than the other region of the drain electrode 142b (the other region is in contact with the substrate 100). The projecting portion 145b has a tapered shape. In other words, the end portions of the source electrode 142a and the drain electrode 142b each have a step shape, and a cross section thereof has a tapered shape.

In each of the projecting portion 145a and the projecting portion 145b, the taper angle can be, for example, from 30° to 60° inclusive. Note that the "taper angle" means an angle formed by the side surface and the bottom surface of a layer having a tapered shape (for example, the source electrode 142a) when observed from a direction perpendicular to a cross section thereof (a plane perpendicular to a surface of the substrate 100).

In a general top-gate transistor, the gate insulating layer has steps (coverage) caused by the thickness of source and drain electrodes in regions where the gate insulating layer covers end portions of the source and drain electrodes, and the thickness of the gate insulating layer in the step portion is locally small as compared with that of the other region. Since withstand voltage is low in such a thin region, an electric field might concentrate on the region, whereby breakdown of a transistor may be caused. In addition, the thin region might cause gate leakage.

However, in the case of the transistor 160 illustrated in FIGS. 1A to 1C, the projecting portion 145a and the projecting portion 145b which have a small thickness are provided at the peripheries of the source electrode 142a and the drain electrode 142b, whereby the thickness is decreased stepwise at the peripheries; thus, coverage with the gate insulating layer 146 is improved, and disconnection and poor connection can be prevented from occurring. Further, with such a structure, formation of a region with a small thickness locally in the gate insulating layer 146 can be suppressed; thus, the withstand voltage of the transistor 160 can be increased and generation of gate leakage can be suppressed.

Further, in the transistor 160, the thickness of the projecting portion 145a is smaller than that of the other region in the source electrode 142a, and the thickness of the projecting portion 145b is smaller than that of the other region in the drain electrode 142b. That is, in each of the projecting portion 145a and the projecting portion 145b, the area of a cross section which is perpendicular to the direction where electric charge flows is smaller. Since resistance is inversely proportional to the area of the cross section, the projecting portion 145a and the projecting portion 145b have higher resistance than the other regions in the source electrode 142a and the drain electrode 142b. In the transistor 160, a high resistance region in the source electrode 142a or the drain electrode 142b is in contact with the channel formation region in the oxide semiconductor layer 144, whereby an electric field between the source and drain can be relaxed, and a short channel effect occurring due to miniaturization of the transistor can be suppressed.

The oxide semiconductor layer 144 is preferably highly purified by sufficient removal of impurities such as hydrogen therefrom or by sufficient supply of oxygen thereto. Specifically, the hydrogen concentration of the oxide semiconductor layer 144 is $5 \times 10^{19}$ atoms/cm$^3$ or lower, preferably $5 \times 10^{18}$ atoms/cm$^3$ or lower, more preferably $5 \times 10^{17}$ atoms/cm$^3$ or lower. Note that the hydrogen concentration of the oxide semiconductor layer 144 is measured by secondary ion mass spectroscopy (SIMS).

The concentration of carriers generated due to a donor such as hydrogen in the oxide semiconductor layer 144, in which hydrogen is reduced to a sufficiently low concentration so that the oxide semiconductor layer is purified and in which defect states in an energy gap due to oxygen deficiency are reduced by sufficiently supplying oxygen as described above, is lower than $1\times10^{12}/cm^3$, preferably lower than $1\times10^{11}/cm^3$, more preferably lower than $1.45\times10^{10}/cm^3$. In addition, for example, the off-state current (per unit channel width (1 μm), here) at room temperature (25° C.) is 100 zA (1 zA (zepto-ampere) is $1\times10^{-21}$ A) or less or 10 zA or less. In this manner, by using an i-type (intrinsic) or substantially i-type oxide semiconductor, the transistor 160 which has extremely favorable off-state current characteristics can be obtained.

Note that as disclosed in Non-Patent Document 1 and the like, a relatively large-size transistor whose channel length is 2 μm to 100 μm can be manufactured with use of an n-type oxide semiconductor having a high carrier density of $2\times10^{19}/cm^3$. However, when such a material is applied to a miniaturized transistor whose channel length is less than 2 μm, the threshold voltage drastically shifts negatively, and thus it is difficult to realize a normally-off transistor. In contrast, an intrinsic or substantially intrinsic oxide semiconductor which is purified has a carrier density of at most lower than $1\times10^{14}/cm^3$, which does not cause a problem of normally on; thus, with use of such an intrinsic or substantially intrinsic oxide semiconductor, a transistor whose channel length is less than 2 μm can be easily realized.

The oxide semiconductor layer 144 is in a single crystal state, a polycrystalline (also referred to as polycrystal) state, an amorphous state, or the like. The oxide semiconductor layer 144 is preferably a CAAC-OS (c-axis aligned crystalline oxide semiconductor) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

A transistor 162 illustrated in FIGS. 2A to 2C is a modification example of the transistor 160 and has a structure similar to that of the transistor 160. FIG. 2A is a plan view of the transistor 162, and FIG. 2B is a cross-sectional view along line A2-B2 in FIG. 2A. FIG. 2C is a cross-sectional view along line C2-D2 in FIG. 2A.

The transistor 162 includes, over the substrate 100 having a surface over which components are formed, the oxide semiconductor layer 144 at least including a channel formation region, the source electrode 142a and the drain electrode 142b which are partly in contact with the oxide semiconductor layer 144, the gate insulating layer 146 which is provided over the source electrode 142a and the drain electrode 142b and in contact with the channel formation region of the oxide semiconductor layer 144, and the gate electrode 148 overlapping with the channel formation region of the oxide semiconductor layer 144 with the gate insulating layer 146 positioned therebetween. The source electrode 142a and the drain electrode 142b each have a step shape at the peripheries.

Further, as similar to the case of the cross section of the transistor 160 in the direction parallel to the channel length illustrated in FIG. 1B, in a cross section of the transistor 162 in a direction parallel to a channel length illustrated in FIG. 2B, the source electrode 142a has, in a region is in contact with the bottom surface of the oxide semiconductor layer 144 (at a periphery of the source electrode 142a), the projecting portion 145a with a smaller thickness than the other region of the source electrode 142a (the other region is not in contact with the oxide semiconductor layer 144), and the projecting portion 145a has a tapered shape. In addition, the drain electrode 142b has, in a region in contact with the bottom surface of the oxide semiconductor layer 144 (at a periphery of the drain electrode 142b), the projecting portion 145b with a smaller thickness than the other region of the drain electrode 142b (the other region is not in contact with the oxide semiconductor layer 144), and the projecting portion 145b has a tapered shape.

Further, since the source electrode 142a or the drain electrode 142b has a step as the projecting portion 145a or the projecting portion 145b at its periphery, the oxide semiconductor layer 144 provided over and in contact with the source electrode 142a and the drain electrode 142b also has a step.

Note that the channel length L of the transistor 162 is preferably less than 2 μm, further preferably, from 10 nm to 350 nm (0.35 μm) inclusive. The thickness of the oxide semiconductor layer 144 is in the range of 1 nm to 50 nm inclusive, preferably, 2 nm to 20 nm inclusive, further preferably, 3 nm to 15 nm inclusive. With such a structure, a semiconductor device which operates at high speed and consumes less power can be achieved.

The difference between the transistor 162 of FIGS. 2A to 2C and the transistor 160 of FIGS. 1A to 1C lies in an arrangement of the source electrode and the drain electrode. In the transistor 160, part of the top surface and side surfaces of the oxide semiconductor layer 144 are in contact with the source electrode 142a and the drain electrode 142b. On the other hand, in the transistor 162, part of the bottom surface of the oxide semiconductor layer 144 is in contact with the source electrode 142a and the drain electrode 142b.

In the transistor 162 illustrated in FIGS. 2A to 2C, the projecting portion 145a and the projecting portion 145b which have a small thickness are provided at the peripheries of the source electrode 142a and the drain electrode 142b, so that the thickness of the end portion is decreased stepwise at the peripheries. Thus, the coverage with the oxide semiconductor layer 144 and the coverage with the gate insulating layer 146 are improved, and disconnection and poor connection can be prevented from occurring. Further, with such a structure, formation of a region with a small thickness locally in the oxide semiconductor layer 144 and the gate insulating layer 146 can be suppressed; thus, the withstand voltage of the transistor 162 can be improved and generation of gate leakage can be suppressed.

Furthermore, in the transistor 162, the thickness of the projecting portion 145a is smaller than that of the other region in the source electrode 142a, and the thickness of the projecting portion 145b is smaller than that of the other region in the drain electrode 142b. Thus, the projecting portion 145a and the projecting portion 145b have higher resistance than the other regions in the source electrode 142a and the drain electrode 142b. In the transistor 162, the high resistance region in the source electrode 142a or the drain electrode 142b is in contact with the channel formation region of the oxide semiconductor layer 144, whereby an electric field between the source and drain can be relaxed, and a short channel effect occurring due to miniaturization of the transistor can be suppressed.

<Example of Manufacturing Process of Transistor>

Hereinafter, a manufacturing process of a transistor according to this embodiment will be described with reference to FIGS. 3A to 3E and FIGS. 4A to 4E.

<Manufacturing Process of Transistor 160>

An example of a method for manufacturing the transistor 160 illustrated in FIGS. 1A to 1C is described with reference to FIGS. 3A to 3E.

First, an oxide semiconductor layer is formed over the substrate 100 having a surface over which components are formed, and the oxide semiconductor layer is processed, so that the oxide semiconductor layer 144 is formed.

Note that there is no particular limitation on a substrate that can be used as the substrate 100 as long as it has at least heat resistance to withstand later heat treatment. For example, a substrate such as a glass substrate, a ceramic substrate, a quartz substrate, or a sapphire substrate can be used. As long as the substrate 100 has an insulating surface, a single crystal semiconductor substrate or a polycrystalline semiconductor substrate of silicon, carbon silicon, or the like; a compound semiconductor substrate of silicon germanium or the like; an SOI substrate; or the like can be used, and a semiconductor element can be provided over the substrate. Further, a base film may be provided over the substrate 100.

The oxide semiconductor layer 144 contains at least one elements selected from In, Ga, Sn, and Zn. For example, the following oxide can be used: an oxide of four metal elements, such as an In—Sn—Ga—Zn—O-based oxide semiconductor; an oxide of three metal elements, such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; an oxide of two metal elements, such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based material; or an oxide of one metal element, such as an In—O-based oxide semiconductor, a Sn—O-based oxide semiconductor, or a Zn—O-based oxide semiconductor. In addition, any of the above oxide semiconductors may contain an element other than In, Ga, Sn, and Zn, for example, $SiO_2$.

Note that for example, an In—Ga—Zn—O-based oxide semiconductor means an oxide semiconductor containing indium (In), gallium (Ga), and zinc (Zn), and there is no limitation on the composition ratio thereof.

For the oxide semiconductor layer, a thin film expressed by a chemical formula of $InMO_3(ZnO)_m$ (m>0) can be used. Here, M represents one or more metal elements selected from Zn, Ga, Al, Mn, and Co. For example, M can be Ga, Ga and Al, Ga and Mn, Ga and Co, or the like.

In the case where an In—Zn—O-based material is used as an oxide semiconductor, a target has a composition ratio where In:Zn=50:1 to 1:2 in an atomic ratio ($In_2O_3$: ZnO=25:1 to 1:4 in a molar ratio), preferably, In:Zn=20:1 to 1:1 in an atomic ratio ($In_2O_3$:ZnO=10:1 to 1:2 in a molar ratio), further preferably, In:Zn=15:1 to 1.5:1 in an atomic ratio ($In_2O_3$:ZnO=15:2 to 3:4 in a molar ratio). For example, in a target used for formation of an In—Zn—O-based oxide semiconductor which has an atomic ratio where In:Zn:O=X:Y:Z, the relation, Z>1.5X+Y, is satisfied.

The filling rate of the oxide target is greater than or equal to 90% and less than or equal to 100%, preferably greater than or equal to 95% and less than or equal to 99.9%. This is because, with use of the target with a high filling rate, a dense oxide semiconductor layer can be formed.

The thickness of the oxide semiconductor layer 144 is preferably greater than or equal to 3 nm and less than or equal to 30 nm. The transistor might possibly be normally on when the oxide semiconductor layer 144 is too thick (e.g., the thickness is greater than or equal to 50 nm).

The oxide semiconductor layer is preferably formed by a method in which impurities such as hydrogen, water, a hydroxyl group, or a hydride do not enter the oxide semiconductor layer. For example, a sputtering method can be used.

The deposition atmosphere may be a rare gas (typically argon) atmosphere, an oxygen atmosphere, or a mixed atmosphere containing a rare gas and oxygen. An atmosphere of a high-purity gas from which an impurity such as hydrogen, water, a hydroxyl group, or a hydride is removed is preferable, in order to prevent hydrogen, water, a hydroxyl group, a hydride, or the like from entering the oxide semiconductor layer.

For example, the oxide semiconductor layer can be formed as follows.

First, the substrate is held in a deposition chamber which is kept under reduced pressure, and then is heated so that the substrate temperature reaches a temperature higher than 200° C. and lower than or equal to 500° C., preferably higher than 300° C. and lower than or equal to 500° C., further preferably higher than or equal to 350° C. and lower than or equal to 450° C.

Then, a high-purity gas in which impurities such as hydrogen, water, a hydroxyl group, or a hydride are sufficiently removed is introduced into the deposition chamber from which remaining moisture is being removed, and the oxide semiconductor layer is formed over the substrate with use of the target. To remove moisture remaining in the deposition chamber, an entrapment vacuum pump such as a cryopump, an ion pump, or a titanium sublimation pump is desirably used. Further, an evacuation unit may be a turbo pump provided with a cold trap. In the deposition chamber which is evacuated with the cryopump, for example, impurities such as hydrogen, water, a hydroxyl group, or a hydride (preferably, also a compound containing a carbon atom) or the like are removed, whereby the concentration of impurities such as hydrogen, water, a hydroxyl group, or a hydride in the oxide semiconductor layer formed in the deposition chamber can be reduced.

In the case where the substrate temperature is low (for example, 100° C. or lower) during deposition, a substance including a hydrogen atom may enter the oxide semiconductor; thus, it is preferable that the substrate be heated at a temperature in the above range. When the oxide semiconductor layer is formed under the condition where the substrate is heated at the above temperature, the substrate temperature is increased, so that hydrogen bonds are cut by heat and are less likely to be taken into the oxide semiconductor layer. Therefore, the oxide semiconductor layer is formed under the condition where the substrate is heated at the temperature, whereby the concentration of impurities such as hydrogen, water, a hydroxyl group, or a hydride in the oxide semiconductor layer can be sufficiently reduced. Moreover, damage due to sputtering can be reduced.

Note that before the oxide semiconductor layer is formed by a sputtering method, powdery substances (also referred to as particles or dust) attached on a formation surface of the oxide semiconductor layer are preferably removed by reverse sputtering in which an argon gas is introduced and plasma is generated. The reverse sputtering refers to a method in which a voltage is applied to a substrate side to generate plasma in the vicinity of the substrate to modify a surface. Note that instead of argon, a gas of nitrogen, helium, oxygen or the like may be used.

The oxide semiconductor layer can be processed by being etched after a mask having a desired shape is formed over the oxide semiconductor layer. The mask may be formed by a method such as photolithography or an ink-jet method. For the etching of the oxide semiconductor layer, either wet etching or dry etching may be employed. It is needless to say that both of them may be employed in combination.

Further, it is preferable to perform heat treatment (first heat treatment) on the oxide semiconductor layer 144 (or the oxide semiconductor layer which has not been processed into an island-shaped oxide semiconductor layer). Performing the heat treatment can eliminate substances including hydrogen atoms in the oxide semiconductor layer 144. The heat treatment is performed in an inert gas atmosphere at higher than or equal to 250° C. and lower than or equal to 700° C., preferably higher than or equal to 450° C. and lower than or equal to 600° C. or lower than a strain point of the substrate. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is greater than or equal to 6 N (99.9999%), preferably greater than or equal to 7 N (99.99999%) (that is, the concentration of the impurities is lower than or equal to 1 ppm, preferably lower than or equal to 0.1 ppm).

The impurities are reduced by the heat treatment. Accordingly, with such an oxide semiconductor layer, a transistor having extremely excellent characteristics can be realized.

The above heat treatment has an effect of removing hydrogen, water, and the like and can be referred to as dehydration treatment, dehydrogenation treatment, or the like. The heat treatment can be performed at the timing, for example, before the oxide semiconductor layer is processed to have an island shape, after the gate insulating film is formed, or the like. Such dehydration treatment or dehydrogenation treatment may be conducted once or plural times.

Figure 3A:
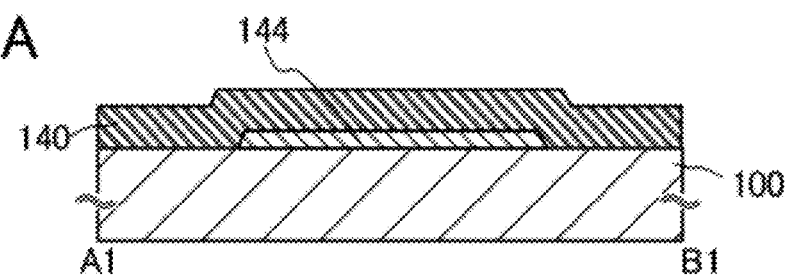
FIGS. 3A to 3E are cross-sectional views illustrating a manufacturing process of a semiconductor device.

Next, a conductive layer 140 with a single-layer structure, which is used for forming a source electrode and a drain electrode (as well as a wiring formed in the same layer as the conductive layer 140) is formed over the oxide semiconductor layer 144 (see FIG. 3A).

The conductive layer 140 can be formed by a PVD method or a CVD method. As a material of the conductive layer 140, an element selected from aluminum, chromium, copper, tantalum, titanium, molybdenum, and tungsten, an alloy containing any of these elements as a component, or the like can be used. Further, one or more materials selected from manganese, magnesium, zirconium, beryllium, neodymium, and scandium may be used.

The conductive layer 140 may be formed using a conductive metal oxide. As the conductive metal oxide, indium oxide, tin oxide, zinc oxide, an alloy of indium oxide and tin oxide, or an alloy of indium oxide and zinc oxide, or any of the aforementioned metal oxide materials to which silicon or silicon oxide is added can be used.

Figure 3B:
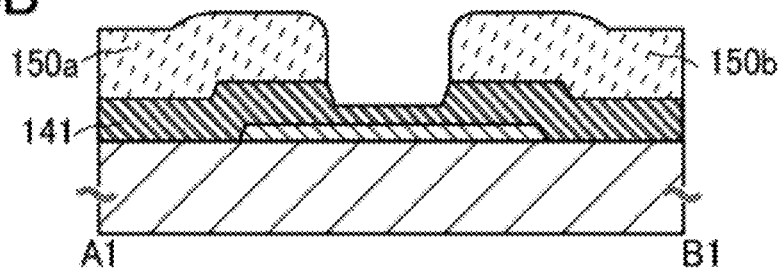

Then, a resist mask 150a and a resist mask 150b are formed over the conductive layer 140 (see FIG. 3B). For example, after the conductive layer 140 is coated with a resist, a photomask is set in a light-exposure apparatus and light is projected on the resist, so that the resist is exposed to light. Then, the resist is developed, so that the resist mask 150a and the resist mask 150b can be formed.

In order to form a channel length of the transistor 160 minutely, light with a wavelength less than or equal to 365 nm can be used as a light source of the light-exposure apparatus. For example, light having a spectrum of a high pressure mercury lamp such as the i-line (with a wavelength of 365 nm), or light with a wavelength in the range from an ultraviolet light region to a visible light region, such as KrF laser light (with a wavelength of 248 nm) or ArF laser light (with a wavelength of 193 nm), can be preferably used.

After formation of the resist mask 150a and the resist mask 150b, the conductive layer 140 is subjected to half etching (the etching is stopped so that the conductive layer 140 is left to cover the substrate) with use of the masks, so that a conductive layer 141 having a recessed portion is formed.

Figure 3C:
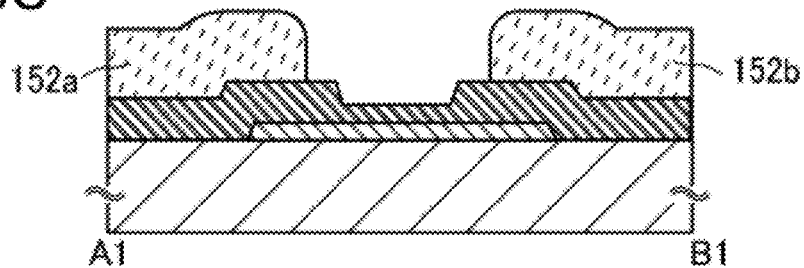

Then, the resist mask 150a and the resist mask 150b are reduced (downsized), whereby a resist mask 152a and a resist mask 152b are formed (see FIG. 3C). In order to reduce the resist masks in size, ashing using oxygen plasma, or the like, may be performed. When the resist masks are reduced (downsized), part of the conductive layer 141 is exposed.

Figure 3D:
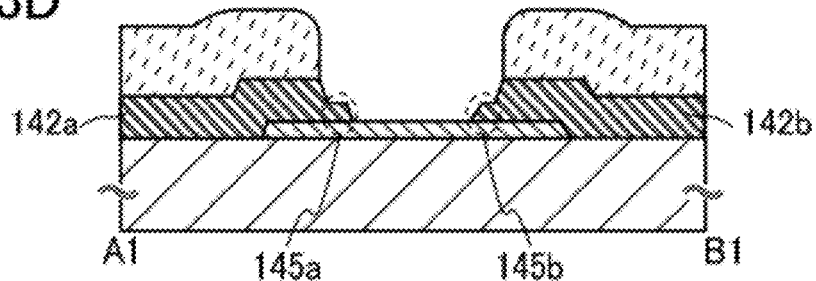

Next, the conductive layer 141 is etched with use of the resist mask 152a and the resist mask 152b, whereby the source electrode 142a and the drain electrode 142b are formed (see FIG. 3D). By etching the exposed part of the conductive layer 141, which is not covered with the resist mask 152a and the resist mask 152b, the projecting portion 145a and the projecting portion 145b are formed at the peripheries of the source electrode 142a and the drain electrode 142b.

Note that as described above, in the case where a miniaturized transistor whose channel length is less than 2 μm is manufactured, light with a short wavelength less than or equal to 365 nm is preferably used as a light source in photolithography in order to improve resolution of the pattern. However, in the case of using light with a wavelength less than or equal to 365 nm for exposure in photolithography, it is difficult to form a tapered shape in an end portion of the pattern. In the manufacturing method of the semiconductor device described in this embodiment, the process of etching the conductive layer is divided into plural steps and performed, so that the projecting portion 145a and the projecting portion 145b in the source electrode 142a and the drain electrode 142b can be formed into a tapered shape.

Note that the projecting portion 145a in the source electrode 142a has the same width and the same thickness as the projecting portion 145b in the drain electrode 142b.

Next, the gate insulating layer 146 is formed so as to cover the source electrode 142a and the drain electrode 142b and to be in contact with part of the oxide semiconductor layer 144.

It is preferable to form the gate insulating layer 146 using an oxide insulating layer from which part of contained oxygen is released by heating. The oxide insulating layer which contains oxygen at an amount exceeding the amount of oxygen in its stoichiometric composition is preferably used as the oxide insulating layer from which part of contained oxygen is released by heating. The oxide insulating layer from which part of contained oxygen is released by heating enables oxygen to diffuse into the oxide semiconductor layer 144 by heating. Typical examples of the oxide insulating layer which can be used for the gate insulating layer 146 include a silicon oxide layer, a silicon oxynitride layer, a silicon nitride oxide layer, an aluminum oxide layer, an aluminum oxynitride layer, a gallium oxide layer, a hafnium oxide layer, and a yttrium oxide layer.

After the gate insulating layer 146 is formed, second heat treatment is desirably performed in an inert gas atmosphere or an oxygen atmosphere. The temperature of the heat treatment is set in the range of 200° C. to 450° C. inclusive, preferably 250° C. to 350° C. inclusive. For example, the heat treatment may be performed at 250° C. for an hour in a nitrogen atmosphere. The second heat treatment enables variation in electric characteristics of the transistor to be reduced. Further, in the case where the gate insulating layer 146 contains oxygen, oxygen is supplied to the oxide semiconductor layer 144 to cover oxygen deficiency in the oxide semiconductor layer 144, so that an i-type (intrinsic semiconductor) or substantially i-type oxide semiconductor layer can be formed.

Note that in this embodiment, the second heat treatment is performed after the gate insulating layer 146 is formed; the timing of the second heat treatment is not limited thereto. For example, the second heat treatment may be performed after the gate insulating layer is formed. Alternatively, the second treatment may also serve as the first heat treatment.

By performing the first heat treatment and the second heat treatment as described above, the oxide semiconductor layer 144 can be highly purified so as to include the substance including a hydrogen atom as few as possible.

Figure 3E:
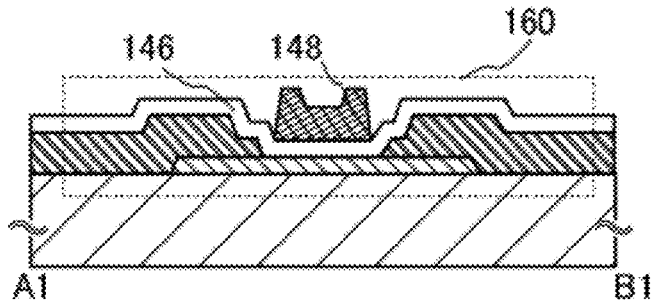

Next, a conductive layer for forming a gate electrode (as well as a wiring formed in the same layer as the gate electrode) is formed and is processed, so that the gate electrode 148 is formed (see FIG. 3E).

The gate electrode 148 can be formed using any of metal materials such as molybdenum, titanium, tantalum, tungsten, aluminum, copper, neodymium, and scandium, and an alloy material containing any of these materials as its main component. Note that the gate electrode 148 may have a single-layer structure or a stacked structure.

Through the above steps, the transistor 160 is completed.

<Manufacturing Process of Transistor 162>

An example of a manufacturing process of the transistor 162 illustrated in FIGS. 2A to 2C is described with reference to FIGS. 4A to 4E. Note that the manufacturing process of the transistor 162 has a lot in common with that of the transistor 160. That is, hereinafter, some description of the same part is omitted.

Figure 4A:
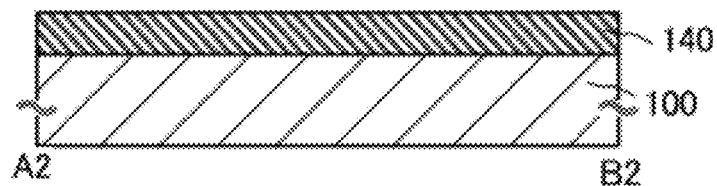
FIGS. 4A to 4E are cross-sectional views illustrating a manufacturing process of a semiconductor device.
Figure 4B:
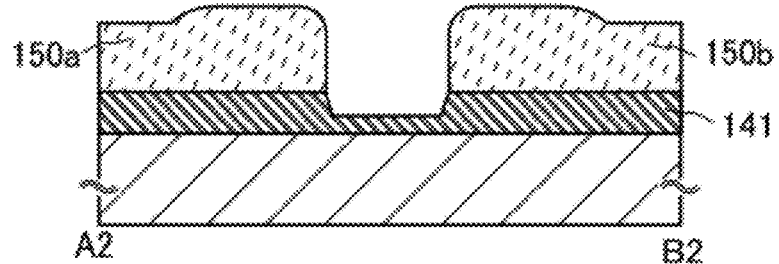

First, the conductive layer 140 is formed over the substrate 100 having a surface over which components are formed (see FIG. 4A).

Next, the resist mask 150a and the resist mask 150b are formed over the conductive layer 140. Then, with use of the masks, the conductive layer 140 is subjected to half etching (etching is stopped so that the conductive layer 140 is left to cover the substrate), so that the conductive layer 141 having a recessed portion is formed (see FIG. 4B).

Figure 4C:
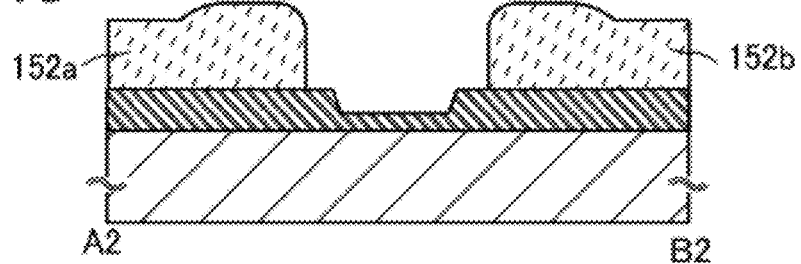
Figure 4D:
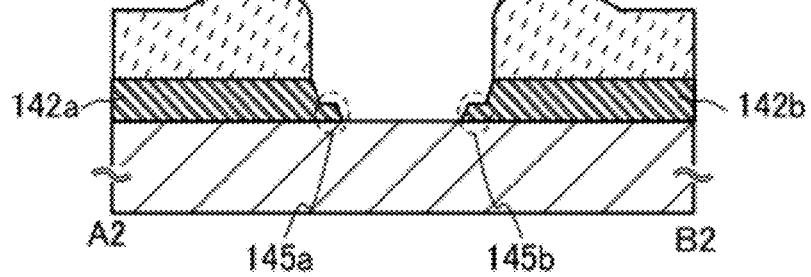
Figure 4E:
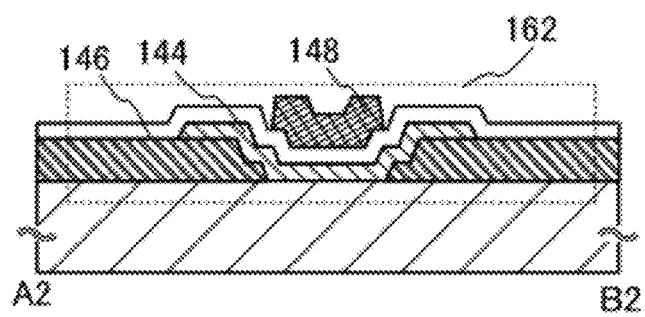

Then, the resist mask 150a and the resist mask 150b are reduced (downsized), whereby the resist mask 152a and the resist mask 152b are formed (see FIG. 4C). By etching the conductive layer 141 with use of the resist mask 152a and the resist mask 152b, the source electrode 142a provided with the projecting portion 145a at the periphery and the drain electrode 142b provided with the projecting portion 145b at the periphery are formed (see FIG. 4D).

After the resist mask 152a and the resist mask 152b are removed, an oxide semiconductor layer is formed and then processed, so that the island-shaped oxide semiconductor layer 144 is formed. Note that before the oxide semiconductor layer is formed, plasma treatment using a gas such as $N_2O$, $N_2$, or Ar may be performed so that moisture or the like attached to a surface where the oxide semiconductor layer is formed may be removed. In addition, with this plasma treatment, the steps formed at the peripheries of the source electrode 142a and the drain electrode 142b can be further downsized; thus, the coverage with the oxide semiconductor layer 144, the gate insulating layer 146, and the like formed over the source electrode 142a and the drain electrode 142b can be further improved. In the case where plasma treatment is performed, the oxide semiconductor layer is preferably formed following the plasma treatment without exposure to the air.

Next, the gate insulating layer 146 is formed so as to cover the source electrode 142a and the drain electrode 142b and to be in contact with part of the oxide semiconductor layer 144. Next, a conductive layer for forming a gate electrode (as well as a wiring formed in the same layer as the gate electrode) is formed and is processed, so that the gate electrode 148 is formed (see FIG. 4E).

Through the above steps, the transistor 162 is completed.

Note that in both the transistor 160 and the transistor 162, the source electrode 142a and the drain electrode 142b each have one projecting portion; however, embodiments in the present invention are not limited to the above structure.

For example, a plurality of projecting portions with different thicknesses may be formed to have a stepped shape at the peripheries of the source electrode 142a and the drain electrode 142b by performing reduction of the resist mask in size and etching with use of the reduced (downsized) resist mask plural times. In the case where a plurality of projecting portions with different thicknesses are formed to have a stepped shape, the projecting portion in the n-th step (n≥1, a projecting portion with the smallest thickness is assumed as a projecting portion in the first step) in the source electrode 142a has the same thickness and the same width as the projecting portion in the n-th step in the drain electrode 142b. Note that the step shape includes a shape in which a plurality of curved surfaces are connected. Further, in the case where a plurality of projecting portions with different thicknesses are formed, each of the plurality of projecting portions preferably has a tapered shape.

Furthermore, a projecting portion may be provided at the periphery of the gate electrode 148. Providing the projecting portion at the periphery of the gate electrode 148, the coverage with an insulating layer formed over the gate electrode 148 can be improved. Thus, concentration of an electric field on the insulating layer, which occurs due to the gate electrode 148 and a wiring provided over the gate electrode 148, can be prevented, and deterioration of or damage on the transistor can be further prevented. Note that in the case of providing a projecting portion at the periphery of the gate electrode 148, the gate electrode 148 is formed to be a single layer using any of the above materials.

Figure 5A:
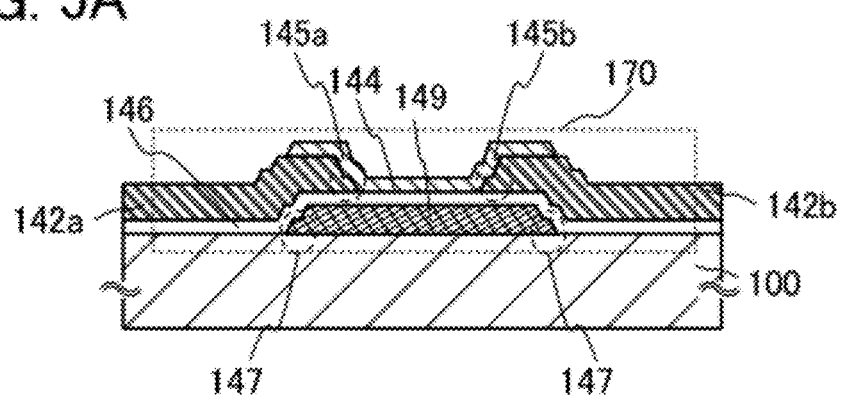
FIGS. 5A and 5B are cross-sectional views each illustrating an example of a structure of a semiconductor device.
Figure 5B:
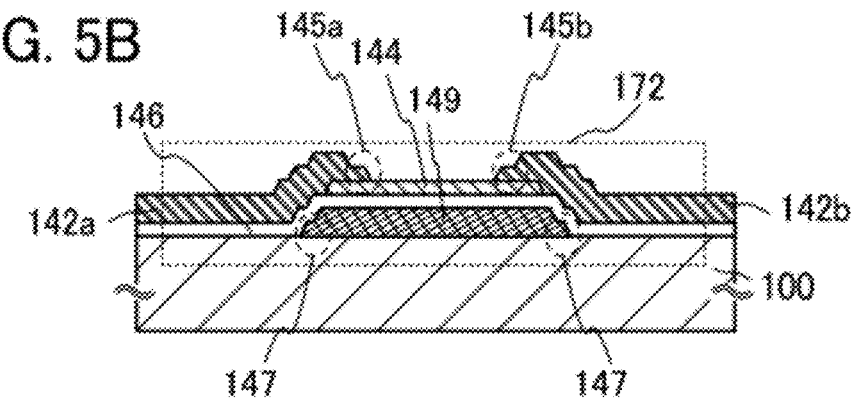

The structure described in this embodiment can be applied to a bottom-gate transistor. FIGS. 5A and 5B illustrate structural examples of bottom-gate transistors.

A transistor 170 illustrated in FIG. 5A includes, over the substrate 100, a gate electrode 149, the gate insulating layer 146 provided to be in contact with the gate electrode 149, the source electrode 142a and the drain electrode 142b provided over the gate insulating layer 146, and the oxide semiconductor layer 144 which is partly in contact with the source electrode 142a and the drain electrode 142b and overlaps with the gate electrode 149 with the gate insulating layer 146 positioned therebetween.

Note that the channel length L of the transistor 170 is preferably less than 2 μm, further preferably, from 10 nm to 350 nm (0.35 μm) inclusive. The thickness of the oxide semiconductor layer 144 is in the range of 1 nm to 50 nm inclusive, preferably, 2 nm to 20 nm inclusive, further preferably, 3 nm to 15 nm inclusive. With the structure, a semiconductor device which operates at high speed and consumes less power can be achieved.

A transistor 172 illustrated in FIG. 5B includes, over the substrate 100, the gate electrode 149, the gate insulating layer 146 in contact with the gate electrode 149, the oxide semiconductor layer 144 overlapping with the gate electrode 149 with the gate insulating layer 146 positioned therebetween, and the source electrode 142a and the drain electrode 142b partly in contact with the oxide semiconductor layer 144.

In each of the transistor 170 and the transistor 172, the gate electrode 149 is formed to have a single-layer structure using any of the aforementioned materials and, at its periphery, has a projecting portion 147 with a smaller thickness than the other region. With the structure, the coverage with the gate insulating layer 146 is improved, and thus disconnection or poor connection can be prevented from occurring. Further, formation of a region with a small thickness locally in the gate insulating layer 146 can be suppressed; thus, the withstand voltage of the transistor 170 and the transistor 172 can be increased, and generation of gate leakage can be suppressed. Note that the projecting portion 147 can be formed in a manner similar to that of the projecting portion 145a and the projecting portion 145b. Alternatively, a plurality of projecting portions with different thicknesses may be formed to have a stepped shape.

In addition, in the transistor 170, the projecting portion 145a and the projecting portion 145b are provided at the peripheries of the source electrode 142a and the drain electrode 142b. Thus, the coverage with the oxide semiconductor layer 144 can be improved.

Note that in the transistor 172, the projecting portion 145a and the projecting portion 145b are not necessarily provided at the peripheries of the source electrode 142a and the drain electrode 142b. However, it is preferable to provide the projecting portion 145a and the projecting portion 145b because the coverage with an insulating layer (not illustrated) formed over the oxide semiconductor layer 144 can be improved.

In each of the transistor 160, the transistor 162, the transistor 170, and the transistor 172 described in this embodiment, a projecting portion is formed at the periphery of a wiring with a large thickness (the gate electrode, or the source or drain electrode), so that poor coverage with an insulating layer provided in contact with the wiring is prevented. Thus, a thin region is not locally formed in the insulating layer, and damage on a transistor due to concentration of an electric field on the thin region can be prevented.

Further, in a manufacturing process of a miniaturized transistor whose channel length is less than 2 μm, even in the case of using light with a wavelength less than or equal to 365 nm for exposure in photolithography, the projecting portion at the periphery of the gate electrode or the source or drain electrode can be formed to have a tapered shape.

Note that the structures, methods, and the like described in this embodiment can be combined as appropriate with any of the structures, methods, and the like described in the other embodiments.

(Embodiment 2)

In this embodiment, as an example of a semiconductor device, a memory medium (a memory element) will be described. In this embodiment, the transistor using an oxide semiconductor described in Embodiment 1 and a transistor including a material other than an oxide semiconductor are formed over one substrate.

Figure 6A:
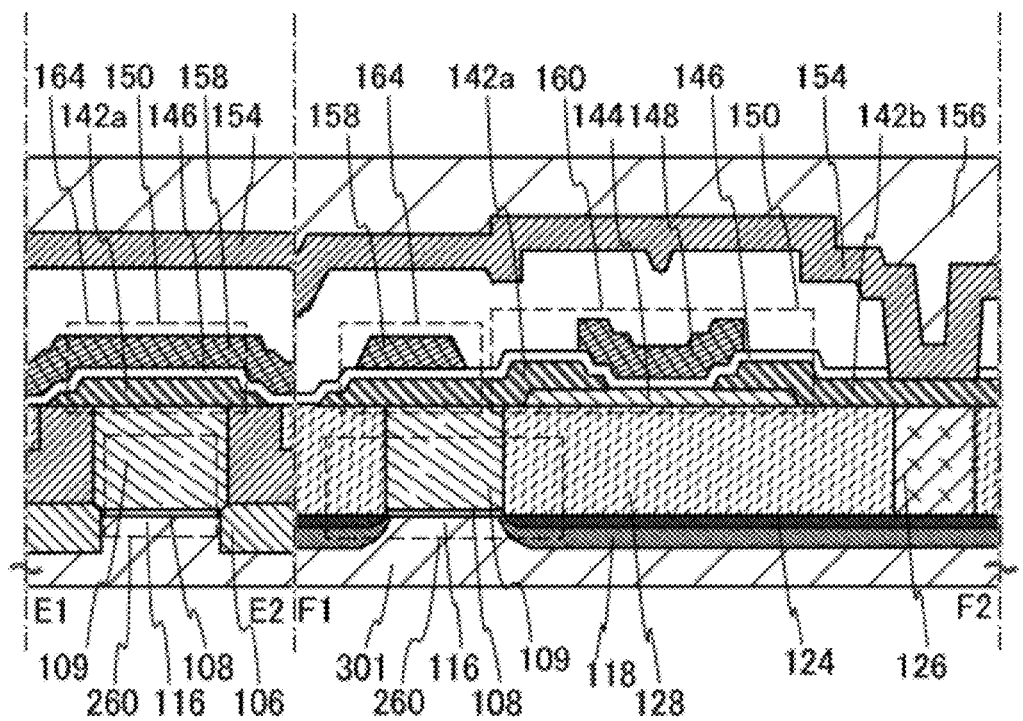
FIGS. 6A to 6C are diagrams illustrating an example of application of a semiconductor device.
Figure 6B:
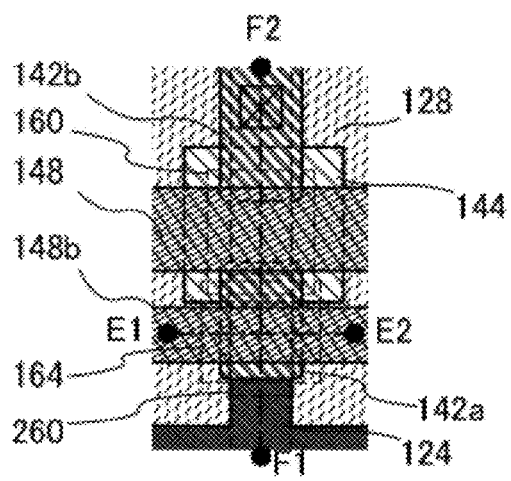
Figure 6C:
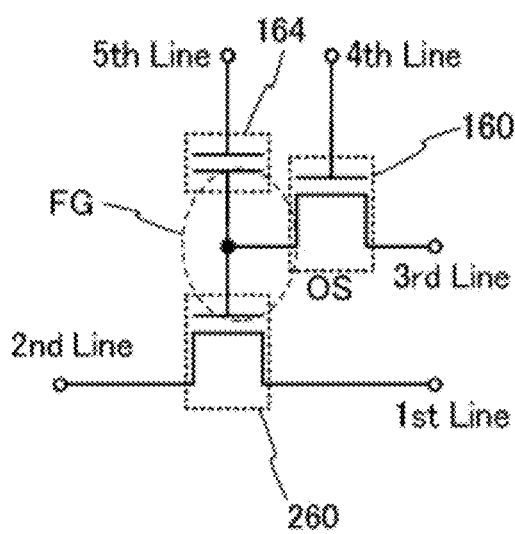

FIGS. 6A to 6C illustrate one example of a structure of the semiconductor device. FIG. 6A illustrates a cross section of the semiconductor device, and FIG. 6B illustrates a top view of the semiconductor device. Here, FIG. 6A is a cross-sectional view along line E1-E2 and line F1-F2 in FIG. 6B. In addition, FIG. 6C illustrates an example of a diagram of a circuit using the semiconductor device as a memory element. The semiconductor device illustrated in FIGS. 6A and 6B includes a transistor including a first semiconductor material in a lower portion, and a transistor including a second semiconductor material in an upper portion. In this embodiment, the transistor including a first semiconductor material refers to a transistor 260 including a semiconductor material other than an oxide semiconductor. As the transistor including a second semiconductor material, the transistor 160 including an oxide semiconductor which is described in Embodiment 1 is used. As the semiconductor material other than an oxide semiconductor, for example, silicon, germanium, silicon germanium, silicon carbide, gallium arsenide, or the like can be used, and a single crystal semiconductor is preferably used. A transistor including such a semiconductor material other than an oxide semiconductor can operate at high speed easily. On the other hand, the transistor 160 including an oxide semiconductor can hold charge for a long time because of its characteristics. Note that as the transistor including the second semiconductor material, any of the transistor described in Embodiment 1 can be used as appropriate.

The transistor 260 in FIGS. 6A to 6C includes a channel formation region 116 provided in a substrate 301 including a semiconductor material (such as silicon), impurity regions 118 provided such that the channel formation region 116 is sandwiched therebetween, metal compound regions 124 in contact with the impurity regions 118, a gate insulating layer 108 provided over the channel formation region 116, and a gate electrode 109 provided over the gate insulating layer 108.

As the substrate 301 including a semiconductor material, a single crystal semiconductor substrate or a polycrystalline semiconductor substrate made of silicon, silicon carbide, or the like; a compound semiconductor substrate made of silicon germanium or the like; an SOI substrate; or the like can be used. Note that although the term "SOI substrate" generally means a substrate in which a silicon semiconductor layer is provided on an insulating surface, the term "SOI substrate" in this specification and the like also includes a substrate in which a semiconductor layer including a material other than silicon is provided on an insulating surface. That is, a semiconductor layer included in the "SOI substrate" is not limited to a silicon semiconductor layer. Moreover, the SOI substrate can be a substrate having a structure in which a semiconductor layer is provided over an insulating substrate such as a glass substrate, with an insulating layer interposed therebetween.

An electrode 126 is connected to part of the metal compound region 124 of the transistor 260. Here, the electrode 126 functions as a source electrode or a drain electrode of the transistor 260. Further, an element isolation insulating layer 106 is provided so as to surround the transistor 260, and an insulating layer 128 is provided so as to cover the transistor 260. Note that in order to obtain high integration, the transistor 260 preferably does not have a sidewall insulating layer as illustrated in FIGS. 6A and 6B. On the other hand, when importance is put on the characteristics of the transistor 260, sidewall insulating layers may be provided on side surfaces of the gate electrode 109, and the impurity region 118 may include regions with different impurity concentrations.

The transistor 260 can be manufactured by a known technique. A feature of the transistor 260 including, for example, silicon, germanium, silicon germanium, silicon carbide, gallium arsenide, or the like, as a semiconductor material, is that it can operate at high speed. Thus, when the transistor is used as a reading transistor, data can be read at a high speed.

After the transistor 260 is formed, as treatment prior to the formation of the transistor 160 and a capacitor 164, the insulating layer 128 is subjected to CMP treatment so that the top surface of the gate electrode 109 is exposed. As treatment for exposing the top surface of the gate electrode 109, as well as CMP treatment, etching treatment or the like can be employed; in order to improve characteristics of the transistor 160, the surface of the insulating layer 128 is preferably made as planar as possible.

The oxide semiconductor layer 144 is formed over the planarized insulating layer 128, and then, a conductive layer is provided so as to cover the exposed gate electrode 109, the electrode 126, the insulating layer 128, the oxide semiconductor layer 144, and the like. After that, the conductive layer is processed by a method similar to that described in Embodiment 1, so that the source electrode 142a and the drain electrode 142b are formed. The source electrode 142a is electrically connected to the gate electrode 109 of the transistor 260. The drain electrode 142b is electrically connected to the electrode 126 of the transistor 260.

In the semiconductor device illustrated in FIGS. 6A and 6B, a conductive layer 158 is provided to overlap with at least part of the source electrode 142a with the gate insulating layer 146 positioned therebetween. The conductive layer 158 is formed in the same step as the gate electrode 148 and functions as one of electrodes of the capacitor 164.

An insulating layer 150 is provided over the gate electrode 148 and the conductive layer 158. A wiring 154 is provided over the insulating layer 150 and is connected to the drain electrode 142b through an opening formed in the insulating layer 150, the gate insulating layer 146, and the like. Here, the wiring 154 is provided so as to at least partly overlap with the oxide semiconductor layer 144 of the transistor 160. Further, an insulating layer 156 is provided so as to cover the wiring 154.

In the semiconductor device illustrated in FIGS. 6A and 6B, the transistor 260 and the transistor 160 are provided so as to at least partly overlap with each other. In particular, the source region or the drain region of the transistor 260 and the oxide semiconductor layer 144 are preferably provided so as to overlap with each other at least partly. The wiring 154 is provided so as to overlap with the oxide semiconductor layer 144 at least partly. In addition, the transistor 160 and the capacitor 164 are provided to overlap with the transistor 260.

For example, the conductive layer 158 of the capacitor 164 is provided so as to at least partly overlap with the gate electrode 109 of the transistor 260. With such a planar layout, high integration of the semiconductor device can be achieved. For example, in the case of forming a memory cell using the semiconductor device, given that the minimum feature size is F, the area occupied by a memory cell can be 15 $F^2$ to 25 $F^2$.

FIG. 6C shows an example of a diagram of a circuit including the semiconductor device as a memory element. In FIG. 6C, one of the source electrode and drain electrode of the transistor 160, one electrode of the capacitor 164, and the gate electrode of the transistor 260 are electrically connected to one another. A first wiring (which is denoted as "1st Line" and also called a source line) and a second wiring (which is denoted as "2nd Line" and also called a bit line) are electrically connected to the source electrode and the drain electrode of the transistor 260, respectively. A third wiring (denoted as "3rd Line", and also called a first signal line) is electrically connected to the other of the source electrode and the drain electrode of the transistor 160. A fourth wiring (denoted as "4th Line", and also called a second signal line) is electrically connected to the gate electrode of the transistor 160. A fifth wiring (denoted as "5th line", and also called a word line) and the other electrode of the capacitor 164 are electrically connected to each other.

The transistor 160 including an oxide semiconductor has extremely small off-state current; therefore, when the transistor 160 is in an off state, the potential of a node (hereinafter, a node FG) where the one of the source electrode and the drain electrode of the transistor 160, the one electrode of the capacitor 164, and the gate electrode of the transistor 260 are electrically connected to one another can be held for an extremely long time. Providing the capacitor 164 facilitates holding of charge given to the node FG and reading of the held data.

When data is stored (written) in the semiconductor device, first, the potential of the fourth wiring is set to a potential at which the transistor 160 is turned on, whereby the transistor 160 is turned on. Thus, the potential of the third wiring is applied to the node FG and a predetermined amount of charge is accumulated in the node FG. Here, charge for applying either two different potential levels (hereinafter referred to as low-level charge and high-level charge) is given to the node FG. After that, the potential of the fourth wiring is set to a potential at which the transistor 160 is turned off, whereby the transistor 160 is turned off. This makes the node FG floating and the predetermined amount of charge is held in the node FG. The predetermined amount of charge is thus accumulated and held in the node FG, whereby the memory cell can store data.

Since the off-state current of the transistor 160 is extremely small, the charge applied to the node FG is held for a long time. This can remove the need of refresh operation or drastically reduce the frequency of the refresh operation, which leads to a sufficient reduction in power consumption. Moreover, stored data can be held for a long time even when power is not supplied.

When stored data is read out (in reading of data), an appropriate potential (a read-out potential) is applied to the fifth wiring in a state where a predetermined potential (a fixed potential) is applied to the first wiring. Thus, the transistor 160 changes its state depending on the amount of charge held in the node FG. This is because in general, when the transistor 160 is an n-channel transistor, an apparent threshold value $V_{th\_H}$ of the transistor 160 in the case where the high-level charge is held in the node FG is lower than an apparent threshold value $V_{th\_L}$ of the transistor 160 in the case where the low-level charge is held in the node FG. Here, an apparent threshold voltage refers to the potential of the fifth wiring, which is needed to turn on the transistor 260. Thus, by setting the potential of the fifth wiring to a potential $V_0$ which is between $V_{th\_H}$ and $V_{th\_L}$, charge held in the node FG can be determined. For example, in the case where High level charge is given in writing, when the potential of the fifth wiring is set to $V_0$ ($>V_{th\_H}$), the transistor 260 is turned on. In the case where Low level charge is given in writing, even when the potential of the fifth wiring is set to $V_0$ ($<V_{th\_L}$), the transistor 260 remains in an off state. In such a manner, by controlling the potential of the fifth wiring and determining whether the transistor 260 is in an on state or off state (reading out the potential of the second wiring), the stored data can be read out.

Further, in order to rewrite stored data, a new potential is applied to the node FG that is holding the predetermined amount of charge given in the above writing, so that the charge of the new data is held in the node FG. Specifically, the potential of the fourth wiring is set to a potential at which the transistor 160 is turned on, so that the transistor 160 is turned on. The potential of the third wiring (a potential of new data) is applied to the node FG, and the predetermined amount of charge is accumulated in the node FG. After that, the potential of the fourth wiring is set to a potential at which the transistor 160 is turned off, whereby the transistor 160 is turned off. Thus, charge of the new data is held in the node FG. In other words, while the predetermined amount of charge given in the first writing is held in the node FG, the same operation (a second writing) as in the first writing is performed, whereby the stored data can be overwritten.

The off-state current of the transistor 160 described in this embodiment can be sufficiently reduced by using the oxide semiconductor layer 144 which is highly purified to be intrinsic. Then, by using such a transistor, a semiconductor device in which stored data can be hold for an extremely long time can be obtained. Further, with use of the transistor 160 whose channel length (L) is reduced, the degree of integration of the semiconductor device can be increased.

In the semiconductor device described in this embodiment, the transistor 260 and the transistor 160 overlap with each other; therefore, a semiconductor device whose integration degree is sufficiently improved can be achieved.

The methods and structures described in this embodiment can be combined as appropriate with any of the methods and structures described in the other embodiments.

(Embodiment 3)

In this embodiment, an example of application of a semiconductor device according to one embodiment of the disclosed invention will be described with reference to FIG. 7. Here, a central processing unit (CPU) is described.

Figure 7:
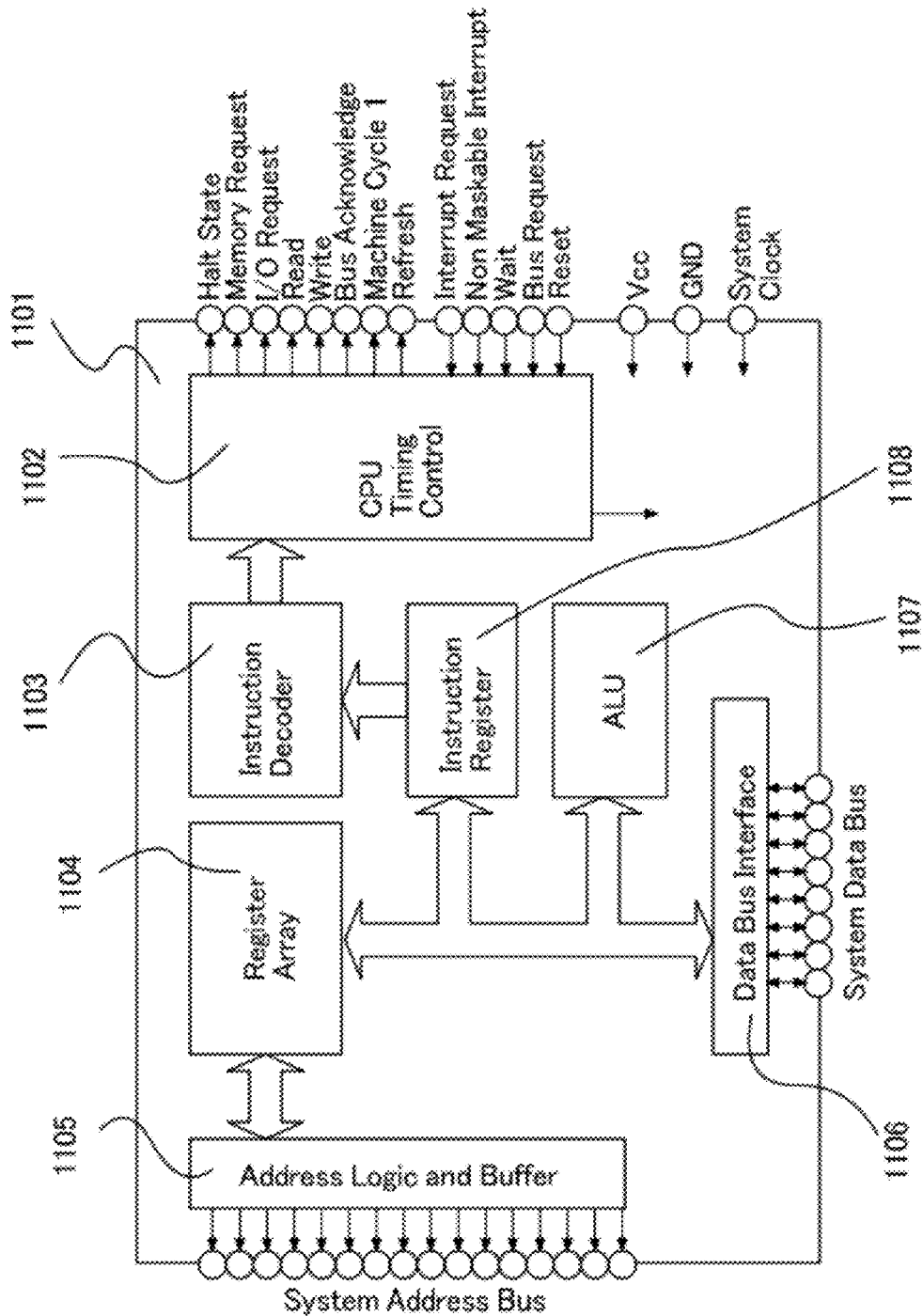
FIG. 7 is a diagram illustrating an example of application of a semiconductor device.

An example of a block diagram of a CPU is illustrated in FIG. 7. A CPU 1101 illustrated in FIG. 7 includes a timing control circuit 1102, an instruction decoder 1103, a register array 1104, an address logic and buffer circuit 1105, a data bus interface 1106, an arithmetic logic unit (ALU) 1107, an instruction register 1108, and the like.

These circuits are manufactured using an inverter circuit, a resistor, a capacitor, the transistor described in the above embodiment, and the like. Furthermore, with the use of any of the transistors described in the above embodiment, the short-channel effect of the transistor can be suppressed, and miniaturization can be achieved.

Circuits included in the CPU 1101 will be briefly described below. The timing control circuit 1102 receives instructions from the outside, converts the instructions into information for the inside, and transmits the information to another block. In addition, the timing control circuit gives directions such as reading and writing of memory data to the external, according to internal operation. The instruction decoder 1103 functions to convert instructions from the outside into instructions for the inside. The register array 1104 functions to temporarily store data. The address logic and buffer circuit 1105 functions to specify the address of an external memory. The data bus interface 1106 functions to take data in and out of an external memory or a device such as a printer. The ALU 1107 functions to perform an operation. The instruction register 1108 functions to temporarily store instructions. The CPU includes combination of such circuits.

With the use of any of the transistors described in the above embodiments in at least part of the CPU 1101, the short-channel effect of the transistor can be suppressed, and miniaturization can be achieved. Thus, the CPU 1101 can have higher integration.

The methods and structures described in this embodiment can be combined as appropriate with any of the methods and structures described in the other embodiments.

(Embodiment 4)

In this embodiment, application examples of a semiconductor device according to one embodiment of the disclosed invention will be described with reference to FIGS. 8A and 8B. Here, an example of a semiconductor device having an image sensor function for reading information of an object will be described. Note that in a circuit diagram, in some cases, "OS" is written beside a transistor in order to indicate that the transistor includes an oxide semiconductor.

Figure 8A:
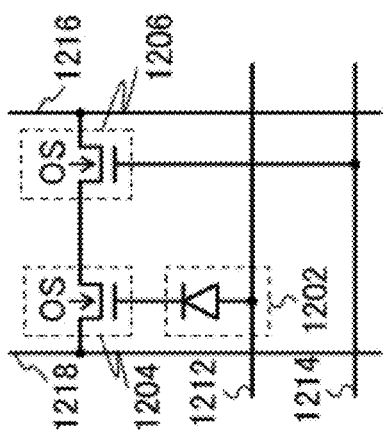
FIGS. 8A and 8B are diagrams illustrating an example of application of a semiconductor device.

FIG. 8A shows an example of a semiconductor device having an image sensor function. FIG. 8A is an equivalent circuit of a photo sensor and FIG. 8B is a cross-sectional view showing part of the photo sensor.

One electrode of a photodiode 1202 is electrically connected to a photodiode reset signal line 1212, and the other electrode of the photodiode 1202 is electrically connected to a gate of a transistor 1204. One of a source electrode and a drain electrode of the transistor 1204 is electrically connected to a photosensor reference signal line 1218, and the other of the source electrode and the drain electrode of the transistor 1204 is electrically connected to one of a source electrode and a drain electrode of a transistor 1206. A gate electrode of the transistor 1206 is electrically connected to a gate signal line 1214, and the other of the source electrode and the drain electrode of the transistor 1206 is electrically connected to a photosensor output signal line 1216.

Here, transistors including an oxide semiconductor are used as the transistor 1204 and the transistor 1206 illustrated in FIG. 8A. As the transistors including an oxide semiconductor, any of the transistors described in the above embodiments can be used. Because the transistors described in the above embodiments can achieve an extremely small leakage current in an off state, the photodetection accuracy of the photosensor can be improved. Furthermore, with use of any of the transistors described in the above embodiments, the short-channel effect of the transistor can be suppressed, and miniaturization can be achieved. Thus, the area of the photodiode can be increased, and the photodetection accuracy of the photosensor can be improved.

Figure 8B:
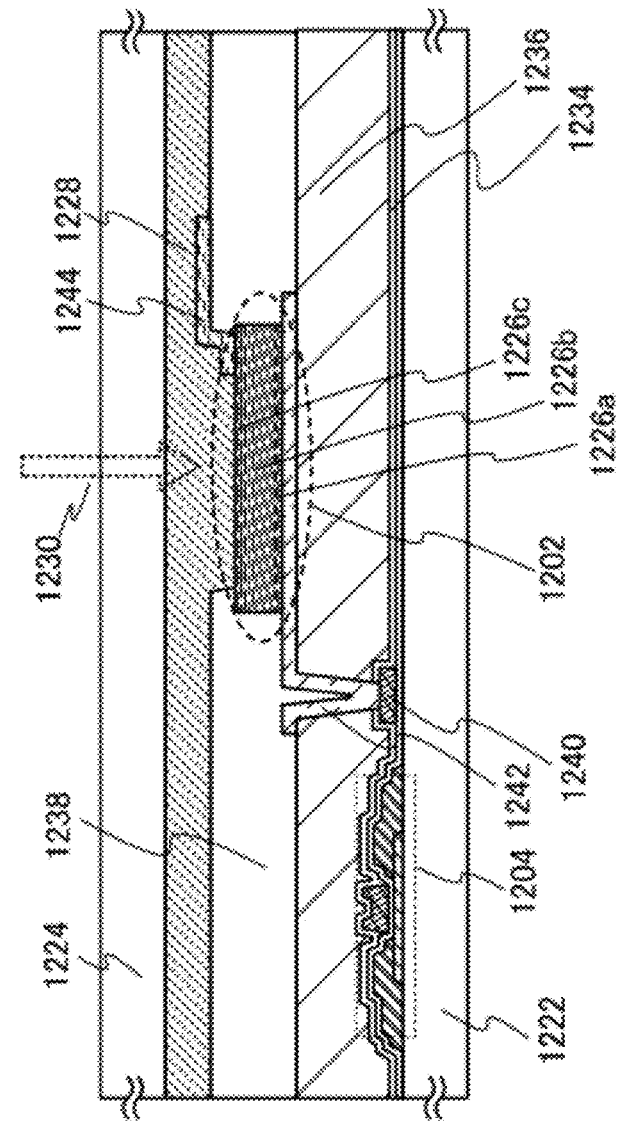

FIG. 8B is a cross-sectional view illustrating the photodiode 1202 and the transistor 1204 in the photosensor, where the photodiode 1202 and the transistor 1204 which function as a sensor are provided over a substrate 1222 having an insulating surface (TFT substrate). A substrate 1224 is provided over the photodiode 1202 and the transistor 1204 using an adhesive layer 1228. An insulating layer 1234, an interlayer insulating layer 1236, and an interlayer insulating layer 1238 are provided over the transistor 1204.

In addition, a gate electrode 1240 is provided in the same layer as the gate electrode of the transistor 1204 so as to be electrically connected to the gate electrode. The gate electrode 1240 is electrically connected to an electrode layer 1242 provided over the interlayer insulating layer 1236, through an opening formed in the insulating layer 1234 and the interlayer insulating layer 1236. Because the photodiode 1202 is formed over the electrode layer 1242, the photodiode 1202 and the transistor 1204 are electrically connected to each other through the gate electrode 1240 and the electrode layer 1242.

The photodiode 1202 has a structure in which a first semiconductor layer 1226a, a second semiconductor layer 1226b, and a third semiconductor layer 1226c are stacked in this order over the electrode layer 1242. In other words, the first semiconductor layer 1226a of the photodiode 1202 is electrically connected to the electrode layer 1242. The third semiconductor layer 1226c of the photodiode 1202 is electrically connected to an electrode layer 1244 provided over the interlayer insulating layer 1238.

Here, a pin photodiode is given as an example, in which a semiconductor layer having n-type conductivity as the first semiconductor layer 1226a, a high-resistance semiconductor layer (an i-type semiconductor layer) as the second semiconductor layer 1226b, and a semiconductor layer having p-type conductivity as the third semiconductor layer 1226c are stacked.

The first semiconductor layer 1226a is an n-type semiconductor layer and is formed with an amorphous silicon film containing an impurity element imparting n-type conductivity. The first semiconductor layer 1226a is formed by a plasma CVD method with use of a semiconductor source gas containing an impurity element belonging to Group 15 (such as phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with use of a diffusion method or an ion injecting method. Heating or the like may be conducted after introducing the impurity element by an ion injecting method or the like in order to diffuse the impurity element. In this case, as a method for forming the amorphous silicon film, an LPCVD method, a chemical vapor deposition method, a sputtering method, or the like may be used. The first semiconductor layer 1226a is preferably formed so as to have a thickness of 20 nm to 200 nm inclusive.

The second semiconductor layer 1226b is an i-type semiconductor layer (an intrinsic semiconductor layer) and is formed from an amorphous silicon film. As the second semiconductor layer 1226b, an amorphous silicon film is formed by a plasma CVD method with use of a semiconductor source gas. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor layer 1226b may alternatively be formed by an LPCVD method, a vapor deposition method, a sputtering method, or the like. The second semiconductor layer 1226b is preferably formed so as to have a thickness of 200 nm to 1000 nm inclusive.

The third semiconductor layer 1226c is a p-type semiconductor layer and is formed using an amorphous silicon film containing an impurity element imparting p-type conductivity. The third semiconductor layer 1226c is formed by a plasma CVD method with use of a semiconductor source gas containing an impurity element belonging to Group 13 (such as boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with use of a diffusion method or an ion injecting method. Heating or the like may be conducted after introducing the impurity element by an ion injecting method or the like in order to diffuse the impurity element. In this case, as a method for forming the amorphous silicon film, an LPCVD method, a chemical vapor deposition method, a sputtering method, or the like may be used. The third semiconductor layer 1226c is preferably formed so as to have a thickness of 10 nm to 50 nm inclusive.

The first semiconductor layer 1226a, the second semiconductor layer 1226b, and the third semiconductor layer 1226c are not necessarily formed using an amorphous semiconductor, and they may be formed using a polycrystalline semiconductor or a microcrystalline semiconductor (or a semi-amorphous semiconductor (SAS)).

The microcrystalline semiconductor belongs to a metastable state of an intermediate between amorphous and single crystalline when Gibbs free energy is considered. That is, the microcrystalline semiconductor film is a semiconductor having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is located in lower wave numbers than 520 $cm^{-1}$, which represents a peak of the Raman spectrum of single crystal silicon. That is, the peak of the Raman spectrum of the microcrystalline silicon exists between 520 $cm^{-1}$ which represents single crystal silicon and 480 $cm^{-1}$ which represents amorphous silicon. In addition, microcrystalline silicon contains hydrogen or halogen of at least 1 atomic percent or more in order to terminate a dangling bond. Moreover, microcrystalline silicon contains a rare gas element such as helium, argon, krypton, or neon to further promote lattice distortion, so that stability is increased and a favorable microcrystalline semiconductor can be obtained.

This microcrystalline semiconductor film can be formed by a high-frequency plasma CVD method with a frequency of higher than or equal to several tens of megahertz and lower than or equal to several hundreds of megahertz or a microwave plasma CVD method with a frequency of 1 GHz or higher. The microcrystalline semiconductor film can be typically formed using a dilution of silicon hydride such as $SiH_4$, $Si_2H_6$, $SiH_2Cl_2$, $SiHCl_3$, $SiCl_4$, or $SiF_4$ with hydrogen. With a dilution with one or a plural kinds of rare gas elements selected from helium, argon, krypton, or neon in addition to silicon hydride and hydrogen, the microcrystalline semiconductor film can be formed. In that case, the flow rate of hydrogen to silicon hydride is 5:1 to 200:1, preferably 50:1 to 150:1, more preferably 100:1. Further, a carbide gas such as $CH_4$ or $C_2H_6$, a germanium gas such as $GeH_4$ or $GeF_4$, $F_2$, or the like may be mixed into the gas containing silicon.

In addition, since the mobility of holes generated by the photoelectric effect is lower than that of electrons, a pin photodiode has better characteristics when a surface on the p-type semiconductor layer side is used as a light-receiving plane. Here, an example where the photodiode 1202 receives incident light 1230 from the substrate 1224 side and converts it into electric signals is described. Further, light from a side on which the semiconductor layer having a conductivity type opposite to that of the semiconductor layer on the light-receiving plane side is disturbance light; therefore, the electrode layer 1242 is preferably formed using a light-blocking conductive film. Note that a surface of the n-type semiconductor layer side can alternatively be used as the light-receiving plane.

When the incident light 1230 enters from the substrate 1224 side, the oxide semiconductor layer of the transistor 1204 can be shielded from the incident light 1230 by the gate electrode of the transistor 1204.

With use of an insulating material, the insulating layer 1234, the interlayer insulating layer 1236, and the interlayer insulating layer 1238 can be formed, depending on the material, with a method such as a sputtering method, an SOG method, a spin coating method, a dip coating method, a spray coating method, or a droplet discharging method (e.g., an inkjet method), a printing method (e.g., screen printing or offset printing), or with a tool (equipment) such as a doctor knife, a roll coater, a curtain coater, or a knife coater.

As an inorganic insulating material of the insulating layer 1234, a single layer or a stack of any of oxide insulating layers or nitride insulating layers such as a silicon oxide layer, a silicon oxynitride layer, a silicon nitride layer, a silicon nitride oxide layer, an aluminum oxide layer, an aluminum oxynitride layer, an aluminum nitride layer, and an aluminum nitride oxide layer can be used. High-density plasma CVD using microwaves (2.45 GHz) is preferably employed because formation of a dense and high-quality insulating layer having high withstand voltage can be formed.

For a reduction of the surface roughness, an insulating layer functioning as a planarization insulating film is preferably used as the interlayer insulating layers 1236 and 1238. The interlayer insulating layer 1236 and the interlayer insulating layer 1238 can be formed using an organic insulating material having heat resistance such as polyimide, acrylic, benzocyclobutene, polyamide, or epoxy. Other than such organic insulating materials, it is possible to use a single layer or stacked layers of a low-dielectric constant material (a low-k material), a siloxane-based resin, phosphosilicate glass (PSG), borophosphosilicate glass (BPSG), or the like.

The photodiode 1202 can read information of an object by detecting the incident light 1230. Note that a light source such as a backlight can be used at the time of reading information on an object.

In the photosensor described above, any of the transistors described in the above embodiments can be used as the transistor including an oxide semiconductor. Because the transistors described in the above embodiments can achieve an extremely small leakage current in an off state, the photodetection accuracy of the photosensor can be improved. Furthermore, with use of any of the transistors described in the above embodiments, the short-channel effect of the transistor can be suppressed, and miniaturization can be achieved. Thus, the area of the photodiode can be increased, and the photodetection accuracy of the photosensor can be improved.

The methods and structures described in this embodiment can be combined as appropriate with any of the methods and structures described in the other embodiments.

(Embodiment 5)

In this embodiment, the case where the semiconductor device described in any of the above embodiments is applied to electronic devices will be described with reference to FIGS. 9A to 9F. In this embodiment, the case where the above semiconductor device is applied to the following electronic devices is described: a computer, a mobile phone set (also referred to as a cellular phone or a mobile phone device), a portable information terminal (including a portable game machine, an audio reproducing device, and the like), a digital camera, a digital video camera, electronic paper, and a television set (also referred to as a television or a television receiver).

Figure 9A:
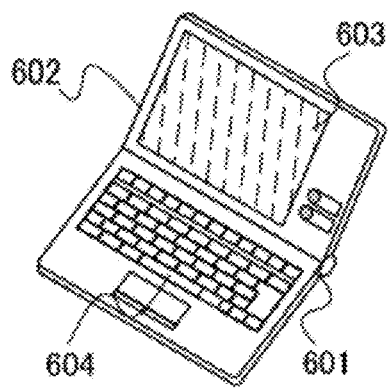
FIGS. 9A to 9F are diagrams each illustrating an electronic device using a semiconductor device.

FIG. 9A illustrates notebook personal computer including a housing 601, a housing 602, a display portion 603, a keyboard 604, and the like. The semiconductor device described in any of the above embodiments is provided in at least one of the housing 601 and the housing 602. Therefore, a notebook personal computer which operates at high speed and consumes less power, for example, can be achieved.

Figure 9D:
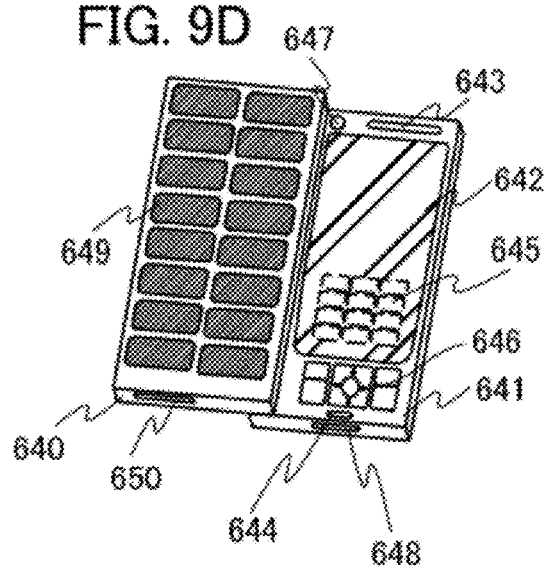
Figure 9B:
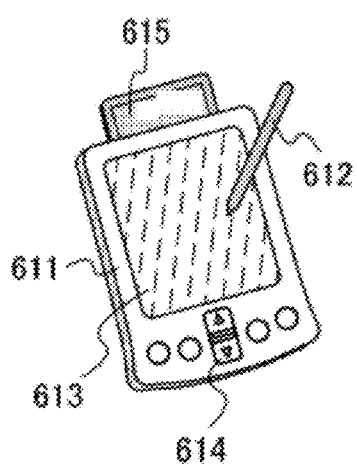

FIG. 9B illustrates a portable information terminal (PDA). A main body 611 is provided with a display portion 613, an external interface 615, operation buttons 614, and the like. Further, a stylus 612 and the like for operation of the portable information terminal are provided. In the main body 611, the semiconductor device described in any of the above embodiments is provided. Therefore, a portable information terminal which operates at high speed and consumes less power, for example, can be achieved.

Figure 9E:
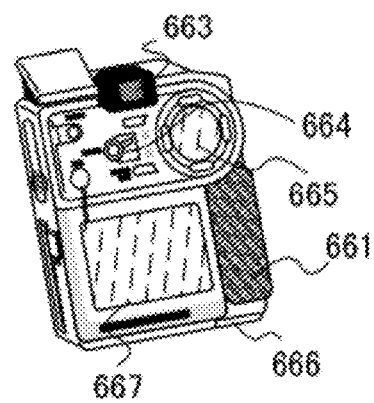
Figure 9C:
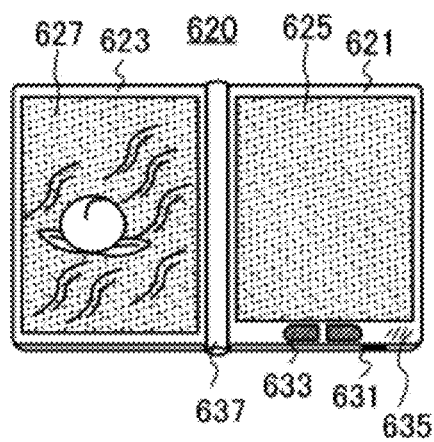

FIG. 9C illustrates an electronic book 620 incorporating electronic paper, which includes two housings, a housing 621 and a housing 623. The housing 621 and the housing 623 are provided with a display portion 625 and a display portion 627, respectively. The housings 621 and 623 are connected by a hinge portion 637 and can be opened or closed with the hinge portion 637. The housing 621 is provided with a power supply 631, an operation key 633, a speaker 635, and the like. At least one of the housings 621 and 623 is provided with the semiconductor device described in any of the above embodiments. Therefore, an electronic book which operates at high speed and consumes less power, for example, can be achieved.

FIG. 9D illustrates a mobile phone set, which includes two housings, a housing 640 and a housing 641. Moreover, the housings 640 and 641 in a state where they are developed as illustrated in FIG. 9D can be slid so that one is lapped over the other. The housing 641 includes a display panel 642, a speaker 643, a microphone 644, an operation key 645, a pointing device 646, a camera lens 647, an external connection terminal 648, and the like. The housing 640 includes a solar cell 649 for charging the mobile phone set, an external memory slot 650, and the like. In addition, an antenna is incorporated in the housing 641. At least one of the housings 640 and 641 is provided with the semiconductor device described in any of the above embodiments. Therefore, a mobile phone set which operates at high speed and consumes less power, for example, can be achieved.

FIG. 9E illustrates a digital camera including a main body 661, a display portion 667, an eyepiece 663, an operation switch 664, a display portion 665, a battery 666, and the like. In the main body 661, the semiconductor device described in any of the above embodiments is provided. Therefore, a digital camera which operates at high speed and consumes less power, for example, can be achieved.

Figure 9F:
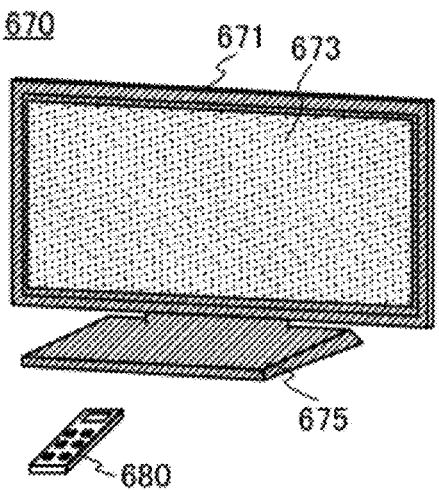

FIG. 9F is a television set 670, which includes a housing 671, a display portion 673, a stand 675, and the like. The television set 670 can be operated with an operation switch of the housing 671 or a remote controller 680. The semiconductor device described in any of the above embodiments is mounted on the housing 671 and the remote controller 680. Therefore, a television set which operates at high speed and consumes less power, for example, can be achieved.

As described above, the electronic devices described in this embodiment each include the semiconductor device described in any of the above embodiments. Therefore, an electronic device whose operation speed is increased and power consumption is reduced by miniaturization of the semiconductor device can be obtained.

EXAMPLE

In this example, an example in which a conductive layer is processed by employing the manufacturing method of a semiconductor device described in Embodiment 1 will be described.

In this example, a structure corresponding to the transistor 160 illustrated in FIGS. 1A to 1C is manufactured. A method for manufacturing samples is described with reference to FIGS. 10A, 10B1 and 10B2, 10C1 and 10C2, and 10D1.

First, over a glass substrate 400, a silicon oxide layer 402 with a thickness of 300 nm was formed as a base film by a sputtering method. Then, an island-shaped oxide semiconductor layer 404 was formed as a semiconductor layer. The oxide semiconductor layer 404 was formed to a thickness of 30 nm by a sputtering method with use of an In—Ga—Zn—O-based target. Then, a tungsten layer 406 was formed to a thickness of 100 nm as a conductive layer over the semiconductor layer (see FIG. 10A).

The tungsten layer 406 was subjected to a first etching with use of a resist mask 410, so that a tungsten layer 408 having a recessed portion was formed (see FIG. 10B1). Note that the i-line exhibiting light with a wavelength of 365 nm was used as a light source for forming the resist mask 410. As an etching apparatus, a dry etching apparatus using a high-density plasma source such as inductively coupled plasma (ICP) was used.

For the first etching, the pressure in a chamber was set to 0.67 Pa and the substrate temperature was set to 40° C. An RF (13.56 MHz) power of 3000 W was applied to a coil of an upper electrode, and a power of 140 W was applied to an electrode on the substrate side. In such a condition, etching was carried out for 10 seconds. As an etching gas, a mixed gas of $CF_4$, $Cl_2$, and $O_2$ was used, where the flow rates of $CF_4$, $Cl_2$, and $O_2$ were 55 sccm, 45 sccm, and 55 sccm.

Next, the resist mask 410 was reduced in size to be a resist mask 412. For reducing the resist mask 410, ashing with oxygen plasma was conducted for 15 seconds under such conditions that the pressure of the chamber used in the first etching was set to 3.0 Pa, the substrate temperature was set to 40° C., an RF power of 2000 W was applied to the coil of the upper electrode, the power applied to the electrode on the substrate side was 0 W, and an $O_2$ gas was made to flow at a flow rate of 100 sccm.

Then, a second etching was performed with use of the resist mask 412, so that a tungsten layer 414 in which a projecting portion is provided at the periphery was obtained (see FIG. 10C1). The second etching was carried out for 15 seconds under such conditions that the pressure of the chamber was set to 0.67 Pa, the substrate temperature was set to 40° C., an RF power of 3000 W was applied to the coil of the upper electrode, and a power of 140 W was applied to the electrode on the substrate side. As an etching gas, a mixed gas of $CF_4$, $Cl_2$, and $O_2$ was used, where the flow rates of $CF_4$, $Cl_2$, and $O_2$ were 55 sccm, 45 sccm, and 55 sccm.

Then, the resist mask 412 was removed (see FIG. 10D1).

In addition, as a comparative example, the oxide semiconductor layer 404 was exposed by one time etching treatment using the resist mask 410, so that a tungsten layer 416 was formed (see FIG. 10B2). Then, the resist mask 410 was removed (see FIG. 10C2).

Figure 11A:
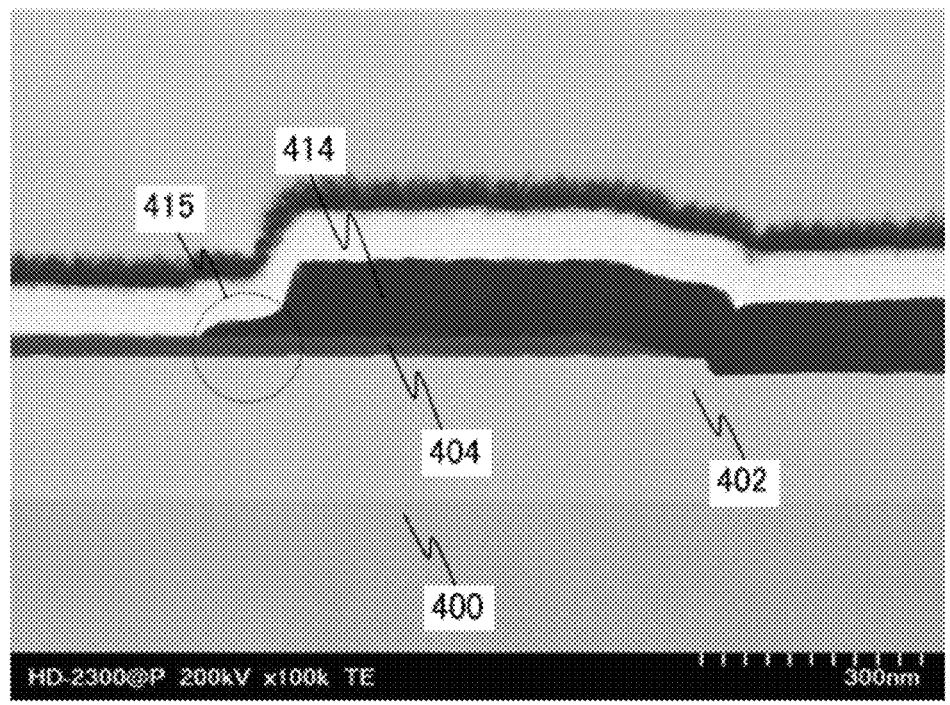
FIGS. 11A and 11B are STEM images of a conductive layer formed in Example.

FIG. 11A is a scanning transmission electron microscope (STEM) image showing an end portion (a region surrounded by a dotted line in FIG. 10D1) of the tungsten layer 414 which had been processed by etching.

Figure 11B:
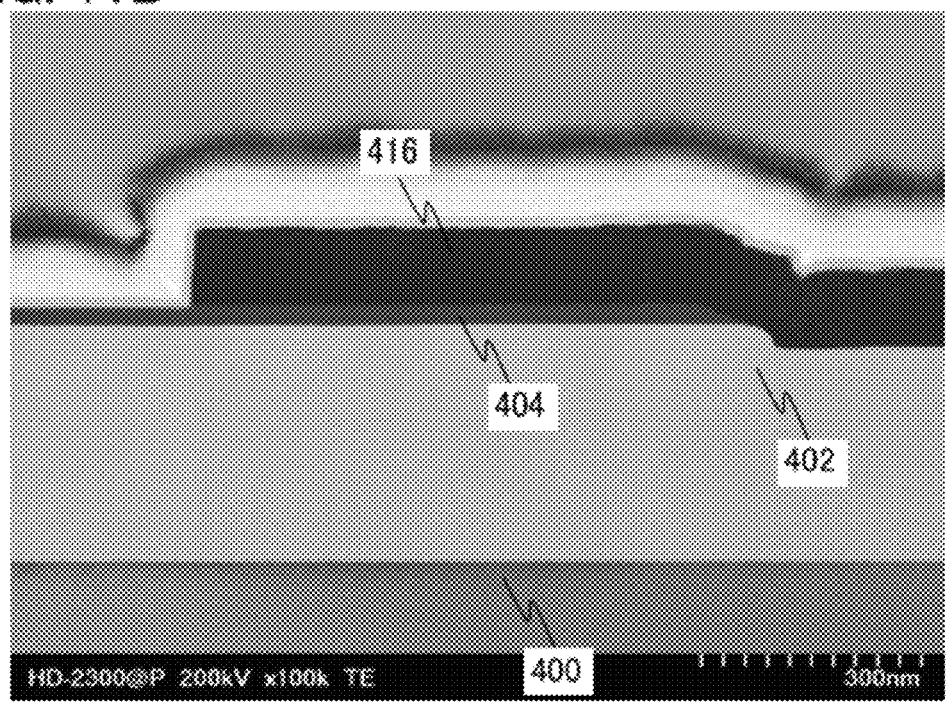

FIG. 11B is an STEM image showing an end portion (a region surrounded by a dotted line in FIG. 10C2) of the tungsten layer 416 which is a comparative example.

As shown in FIG. 11B, when the tungsten layer 406 is subjected to patterning process with one time etching treatment with use of a resist mask formed using the i-line, the end portion of the tungsten layer 416 is not processed into a tapered shape, and a side surface of the tungsten layer 416 becomes substantially perpendicular to the bottom surface. It is supposed that when a thin film is formed over such a conductive layer, disconnection or poor connection easily occurs and a region with a small thickness is locally formed in the thin film.

As shown in FIG. 11A, by applying the manufacturing method described in Embodiment 1, a projecting portion 415 is formed at an end portion of the tungsten layer 414 even in the case where the resist mask is formed using the i-line. In addition, the projecting portion 415 has a tapered shape.

According to the above description, by applying the manufacturing method of a semiconductor device according to one embodiment of the present invention, a projecting portion can be formed at the periphery of a wiring to have a tapered shape even in the case where light with a wavelength less than or equal to 365 nm is used in photolithography.

EXPLANATION OF REFERENCE

100: substrate, 106: element isolation insulating layer, 108: gate insulating layer, 109: gate electrode, 116: channel formation region, 118: impurity region, 124: metal compound region, 126: electrode, 128: insulating layer, 140: conductive layer, 141: conductive layer, 142a: source electrode, 142b: drain electrode, 144: oxide semiconductor layer, 145a: projecting portion, 145b: projecting portion, 146: gate insulating layer, 147: projecting portion, 148: gate electrode, 149: gate electrode, 150: insulating layer, 150a: resist mask, 150b: resist mask, 152a: resist mask, 152b: resist mask, 154: wiring, 156: insulating layer, 158: conductive layer, 160: transistor, 162: transistor, 164: capacitor, 170: transistor, 172: transistor, 260: transistor, 301: substrate, 400: glass substrate, 402: silicon oxide layer, 404: oxide semiconductor layer, 406: tungsten layer, 408: tungsten layer, 410: resist mask, 412: resist mask, 414: tungsten layer, 415: projecting portion, 416: tungsten layer, 601: housing, 602: housing, 603: display portion, 604: keyboard, 611: main body, 612: stylus, 613: display portion, 614: operation button, 615: external interface, 620: electronic book, 621: housing, 623: housing, 625: display portion, 627: display portion, 631: power supply, 633: operation key, 635: speaker, 637: hinge portion, 640: housing, 641: housing, 642: display panel, 643: speaker, 644: microphone, 645: operation key, 646: pointing device, 647: camera lens, 648: external connection terminal, 649: solar cell, 650: external memory slot, 661: main body, 663: eyepiece, 664: operation switch, 665: display portion, 666: battery, 667: display portion, 670: television set, 671: housing, 673: display portion, 675: stand, 680: remote controller, 1101: CPU, 1102: timing control circuit, 1103: instruction decoder, 1104: register array, 1105: address logic and buffer circuit, 1106: data bus interface, 1107: ALU, 1108: instruction register, 1202: photodiode, 1204: transistor, 1206: transistor, 1212: photodiode reset signal line, 1214: gate signal line, 1216: photosensor output signal line, 1218: photosensor reference signal line, 1222: substrate, 1224: substrate, 1226*a*: semiconductor layer, 1226*b*: semiconductor layer, 1226*c*: semiconductor layer, 1228: adhesive layer, 1230: incident light, 1234: insulating layer, 1236: interlayer insulating layer, 1238: interlayer insulating layer, 1240: gate electrode, 1242: electrode layer, 1244: electrode layer This application is based on Japanese Patent Application serial no. 2011-016343 filed with Japan Patent Office on Jan. 28, 2011, the entire contents of which are hereby incorporated by reference.

The invention claimed is:

1. A semiconductor device comprising:
a semiconductor layer including a channel formation region;
a source electrode and a drain electrode formed of a single layer and partly in contact with the semiconductor layer;
a gate insulating layer over the source electrode and the drain electrode and in contact with the channel formation region; and
a gate electrode overlapping with the channel formation region with the gate insulating layer positioned therebetween,
wherein the source electrode and the drain electrode each has a projecting portion,
wherein the projecting portion comprises a first surface and a second surface and overlaps with the semiconductor layer,
wherein the first surface is a side surface of the projecting portion with a tapered shape, and an angle formed by the first surface and the second surface is more than 90° and less than 180°,
wherein a thickness between the second surface and a top surface of the semiconductor layer is thinner than a portion of the source electrode and the drain electrode other than the projecting portion, and
wherein the portion is overlapped with the semiconductor layer.

2. The semiconductor device according to claim 1, wherein the gate insulating layer is in contact with the source electrode and the drain electrode at least in the projecting portions.

3. The semiconductor device according to claim 1, wherein the semiconductor layer is in contact with the source electrode and the drain electrode at least in the projecting portions.

4. The semiconductor device according to claim 1, wherein the projecting portion in the source electrode has substantially the same width and substantially the same thickness as the projecting portion in the drain electrode.

5. The semiconductor device according to claim 1, wherein the semiconductor layer comprises an oxide semiconductor.

6. The semiconductor device according to claim 1, wherein the gate electrode is formed of a single layer and has a projecting portion at a periphery of the gate electrode.

7. An electronic device comprising the semiconductor device according to claim 1, wherein the electronic device is one selected from the group consisting of a computer, a mobile phone set, a portable information terminal, a digital camera, a digital video camera, electronic paper, and a television set.

8. The semiconductor device according to claim 1, wherein the semiconductor layer comprises a c-axis aligned crystalline oxide semiconductor in the channel formation region.

9. The semiconductor device according to claim 1, wherein a channel length of the channel formation region is less than 2 μm.

10. A semiconductor device comprising:
a gate electrode;
a gate insulating layer over the gate electrode;
a semiconductor layer including a channel formation region over the gate insulating layer; and
a source electrode and a drain electrode formed of a single layer and partly in contact with the semiconductor layer,
wherein the source electrode and the drain electrode each has a projecting portion,
wherein the projecting portion comprises a first surface and a second surface and overlaps with the semiconductor layer,
wherein the first surface is a side surface of the projecting portion with a tapered shape, and an angle formed by the first surface and the second surface is more than 90° and less than 180°,
wherein a thickness between the second surface and a top surface of the semiconductor layer is thinner than a portion of the source electrode and the drain electrode other than the projecting portion, and
wherein the portion is overlapped with the semiconductor layer.

11. The semiconductor device according to claim 10, wherein the gate insulating layer is in contact with the source electrode and the drain electrode at least in the projecting portions.

12. The semiconductor device according to claim 10, wherein the projecting portion in the source electrode has substantially the same width and substantially the same thickness as the projecting portion in the drain electrode.

13. The semiconductor device according to claim 10, wherein the semiconductor layer comprises an oxide semiconductor.

14. The semiconductor device according to claim 10, wherein the gate electrode is formed of a single layer, and has a projecting portion at a periphery of the gate electrode.

15. An electronic device comprising the semiconductor device according to claim 10, wherein the electronic device is one selected from the group consisting of a computer, a mobile phone set, a portable information terminal, a digital camera, a digital video camera, electronic paper, and a television set.

16. The semiconductor device according to claim 10, wherein the semiconductor layer comprises a c-axis aligned crystalline oxide semiconductor in the channel formation region.

17. The semiconductor device according to claim 10, wherein a channel length of the channel formation region is less than 2 μm.

* * * * *

UNITED STATES PATENT AND TRADEMARK OFFICE
CERTIFICATE OF CORRECTION

PATENT NO. : 8,987,727 B2
APPLICATION NO. : 13/357902
DATED : March 24, 2015
INVENTOR(S) : Shinya Sasagawa et al.

It is certified that error appears in the above-identified patent and that said Letters Patent is hereby corrected as shown below:

In the Specification

At column 1, line 40, "pp." should be --pp. 1689-1692--.

Signed and Sealed this
Eighteenth Day of August, 2015

Michelle K. Lee
*Director of the United States Patent and Trademark Office*